United States Patent
Youn et al.

(10) Patent No.: US 9,647,052 B2
(45) Date of Patent: May 9, 2017

(54) FLEXIBLE DISPLAY SUBSTRATE, FLEXIBLE ORGANIC LIGHT EMITTING DISPLAY DEVICE AND METHOD FOR MANUFACTURING THE SAME

(71) Applicant: LG Display Co., Ltd., Seoul (KR)

(72) Inventors: Sangcheon Youn, Seoul (KR); HeeSeok Yang, Ansan-si (KR); Sanghyeon Kwak, Paju-si (KR); YoonDong Cho, Gwangmyeong-si (KR); SeYeoul Kwon, Goyang-si (KR); Saemleenuri Lee, Seoul (KR); SoYoung Jo, Seoul (KR); DongYoon Kim, Seongnam-si (KR); AnNa Ha, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/948,106

(22) Filed: Nov. 20, 2015

(65) Prior Publication Data
US 2016/0079336 A1   Mar. 17, 2016

Related U.S. Application Data

(63) Continuation of application No. 14/108,158, filed on Dec. 16, 2013, now Pat. No. 9,318,427.

(30) Foreign Application Priority Data

Feb. 1, 2013   (KR) .......................... 10-2013-0012028
Jul. 15, 2013   (KR) .......................... 10-2013-0082925

(51) Int. Cl.
*H01L 27/32* (2006.01)
*H02K 1/02* (2006.01)
(Continued)

(52) U.S. Cl.
CPC ...... *H01L 27/3276* (2013.01); *H01L 23/4985* (2013.01); *H01L 51/0097* (2013.01);
(Continued)

(58) Field of Classification Search
CPC ............. H01L 27/3297; H01L 27/3276; G02F 2001/13629; G02F 1/136286; H05K 1/028; H05K 1/0281
See application file for complete search history.

(56) References Cited

U.S. PATENT DOCUMENTS

| 5,838,412 A | 11/1998 | Ueda et al. |
| 2005/0122700 A1* | 6/2005 | Kim ...................... H05K 1/028 361/795 |

(Continued)

FOREIGN PATENT DOCUMENTS

| JP | 2009259929 A | 11/2009 |
| JP | 2012-238005 A | 12/2012 |
| WO | WO 01-69577 A2 | 9/2001 |

OTHER PUBLICATIONS

Extended European Search Report for European Patent Application No. EP 13873449.6, Jan. 29, 2016, 8 pages.
(Continued)

*Primary Examiner* — Daniel Luke
(74) *Attorney, Agent, or Firm* — Fenwick & West LLP

(57) ABSTRACT

A flexible display substrate, a flexible organic light emitting display device, and a method of manufacturing the same are provided. The flexible display substrate comprises a flexible substrate including a display area and a non-display area extending from the display area, a first wire formed on the display area of the flexible substrate, and a second wire formed on the non-display area of the flexible substrate, wherein at least a part of the non-display area of the flexible substrate is curved in a bending direction, and the second wire formed on at least a part of the non-display area of the
(Continued)

flexible substrate includes a first portion formed to extend in a first direction and a second portion formed to extend in a second direction.

18 Claims, 29 Drawing Sheets

(51) Int. Cl.

| | | |
|---|---|---|
| *H05K 1/02* | (2006.01) | |
| *H01L 51/52* | (2006.01) | |
| *H01L 23/498* | (2006.01) | |
| *H01L 51/00* | (2006.01) | |
| *G02F 1/1333* | (2006.01) | |
| *G02F 1/1345* | (2006.01) | |

(52) U.S. Cl.
CPC ....... *H01L 51/5203* (2013.01); *H05K 1/0281* (2013.01); *G02F 1/13452* (2013.01); *G02F 1/133305* (2013.01); *H01L 2251/5338* (2013.01); *H01L 2924/0002* (2013.01)

(56) References Cited

U.S. PATENT DOCUMENTS

| | | |
|---|---|---|
| 2005/0211986 A1 | 9/2005 | Konno et al. |
| 2007/0019143 A1 | 1/2007 | Chen et al. |
| 2008/0062074 A1 | 3/2008 | Yaegashi |
| 2010/0213819 A1 | 8/2010 | Cok et al. |
| 2011/0007042 A1 | 1/2011 | Miyaguchi |
| 2012/0062447 A1 | 3/2012 | Tseng et al. |
| 2012/0218219 A1 | 8/2012 | Rappoport et al. |
| 2014/0002385 A1 | 1/2014 | Ka et al. |
| 2014/0055702 A1* | 2/2014 | Park ................ G02F 1/136286 349/43 |
| 2014/0118975 A1* | 5/2014 | Chen .................... H05K 1/0281 361/761 |

OTHER PUBLICATIONS

PCT International Search Report for PCT/KR2013/012242, Apr. 29, 2014, 3 Pages.

* cited by examiner

FLEXIBLE DISPLAY SUBSTRATE, FLEXIBLE ORGANIC LIGHT EMITTING DISPLAY DEVICE AND METHOD FOR MANUFACTURING THE SAME

CROSS-REFERENCE TO RELATED APPLICATIONS

This application is a continuation of U.S. patent application Ser. No. 14/108,158 filed on Dec. 16, 2013, which claims priority to and the benefit of Korean Patent Application No. 2013-0012028 filed on Feb. 1, 2013, and Korean Patent Application No. 2013-0082925 filed on Jul. 15, 2013, the disclosure of which are incorporated herein by reference in their entirety.

BACKGROUND

1. Field of the Invention

The present invention relates generally to a flexible display device, and more particularly to a configuration of components at the curved portion of the flexible display substrate for reducing the effect of bending stress.

2. Discussion of Related Art

Display devices used in monitors of computers, TVs, and cell phones include organic light emitting display devices (OLEDs) and plasma display panels (PDPs), both of which autonomously emit light, and liquid crystal display devices (LCDs) requiring a separate light source, etc.

In recent years, flexible display devices manufactured to display an image even when bent like paper by forming a display unit and a wire on a substrate exhibiting flexibility, such as a flexible material (i.e., a plastic), have received attention as next-generation display devices.

Flexible display devices have been widely used in the field of applications spanning from monitors of computers and TVs to personal portable equipment, and research on flexible display devices having a large display area and a smaller volume and weight has been conducted.

When a flexible display substrates and/or devices are bent, mechanical stress (e.g., tensile or compression stress) is applied to the bent portion of the substrate as well as the components that are disposed on the bent portion, and such mechanical stress can cause cracking at certain weak point of the substrates and/or devices. Isolated crack at one point can propagate and channel across the substrate. If the substrate is brittle the crack may penetrate through the substrate, even though it is essentially unstressed. The interface of two regions, layers and/or portions of certain components may debond, or a debond crack may dive further into the substrate producing delamination via cracking parallel to the interface in the substrate.

Of course, such cracks and breakage can cause various problems in the device. Especially, the mechanical stress at the bent portion may crack or wholly disconnect some portions of the wires formed thereon, thereby causing various defects in the device.

SUMMARY OF THE INVENTION

Embodiments relate to a flexible display device including a flexible substrate and a wire formed on the surface of the flexible substrate. The flexible substrate includes a substantially flat area extending along a plane, and a bending area adjacent to the substantially flat area and bending away from the plane. The flexible display further includes a wire, which extends across at least the bending area, to transmit a signal. The wire includes at least two portions. At least one portion of the wire extends in a first direction. Also, at least one other portion of the wire extends in a second direction, which is non-parallel to the first direction.

In some embodiments, the first direction is substantially perpendicular to a boundary line between the substantially flat area and the bending area.

In some embodiments, the portion of the wire extending in the first direction shorter length than the other portion of the wire extending in the second direction. Further, in some embodiments, the portion of the wire extending in the first direction has a greater width than the other portion of the wire extending in the second direction. The shorter length of the portion of the wire extending in the first direction can reduce the strain to the wire from being bent in the bending area. Further, the increased width at the portion of the wire extending in the first direction can reduce the strain to the wire from being bet in the bending area.

In some embodiments, at least one portion of the wire extending in the first direction includes at least two subsections. The subsections forming the portion of the wire extending in the first direction have at least two different widths. In other words, some subsections may be formed with one width while some other subsections are formed with a different width.

In some embodiments, the portion of the wire extending in the first direction is disposed between two portions of the wire extending in two different directions that are not parallel to the first direction. That is, the portion of the wire extending in the first direction is disposed between a portion of the wire extending in a first non-parallel direction with respect to the first direction and another portion of the wire extending in a second non-parallel direction with respect to the first direction. In some embodiments, said two portions of the wire extending in two different directions non-parallel to the first direction mirror each other relative to the portion of the wire extending in the first direction. In some embodiments, the two portions of the wire extending in the mirrored direction relative to the first direction have the same length from each other.

In some embodiments, the first direction is not perpendicular to the boundary line between the substantially flat area and the bending area. Accordingly, the portion of wire extending in the first direction and the portion of the wire extending in the second direction are not perpendicular to the boundary line between the substantially flat area and the bending area.

In some embodiments, the flexible display device further includes a crack prevention layer between the wire and the flexible substrate.

In some embodiments, the flexible display device further includes a planarization member formed on the surface of the flexible substrate and having a height substantially same as the wire to smoothen a surface of at least one layer formed on the wire.

In some embodiments, the portions of the wire extending in the first and second directions form a series of diamond shapes connected to each other.

In some embodiments, the flexible display device further includes a secondary wire extending across the bending area. The original wire and the secondary wire are configured to carry the same signal. The original wire may be placed in a first layer of the bending area and the secondary wire may be placed in a second layer in the bending area different from the first layer.

In some embodiments, the flexible display device further includes a separation layer formed on the wire, and a secondary wire is formed on the separation layer to transmit another signal from the wire under the separation layer. The secondary wire may intersect with the wire over the separation layer.

In some embodiments, the wire is one of a first group of wires extending parallel to each other. Each wire in the group of wires may transmit a different signal.

In some embodiments, the flexible display device further comprises a second group of wires extending parallel to each other but not parallel to the first group of wires.

Embodiments also relate to a flexible display device including a flexible substrate and a wire. The flexible substrate is bent in a bending direction across which strain of the flexible substrate is the greatest. The wire includes one or more of the first portions extending in a first direction and one or more of the second portions extending in a second direction, in which the first direction and the second direction are different from the bending direction. The first direction forms a first angle relative to the bending direction, and the second direction forms a second angle relative to the bending direction. The first and second portions of the wire are configured to reduce the strain of the wire from being bent in the bending direction.

In some embodiments, the flexible display device further includes a thin film transistor having a gate, a drain and a source, which is formed on the flexible substrate. At least one of the first portions and the second portions of the wire may be formed of the same material as at least one of the gate, the drain and the source.

In some embodiments, the second angle is smaller than the first angle.

In one embodiment, the second angle is smaller than the first angle, and the first portion extending in the first angle is longer than the second portion extending in the second angle.

In one embodiment, the second angle is smaller than the first angle, and the first portion extending in the first angle has is thinner than the second portion extending in the second angle.

In some embodiments, the wire includes multiple first portions and second portions that form an electrical network. The first portions may be formed in an inner layer, and the second portions may be formed in an outer layer having a greater radius of curvature than the inner layer. Accordingly, the collective total length of the first portions is longer than the collective total length of the second portions.

In some embodiments, the width of the second portions is greater than the width of the first portions.

Embodiments also relate to a method of fabricating a flexible organic light emitting display device. A wire is formed on at least a bending area of the flexible substrate to transmit a signal. The wire has a shape of rhombuses connected in series. A thin film transistor is formed on a display area of the flexible display device. An organic light emitting element is formed on the thin film transistor to emit light based on the signal transmitted via the wire.

In some embodiments, the wire is formed simultaneously with at least one of a gate, a source or a drain of the thin film transistor.

In some embodiments, the wire is made of the same material as the at least one of the gate, the source or the drain of the thin film transistor.

In one embodiment, the wire is formed simultaneously with an electrode of the organic light emitting element.

Embodiments also relate to a flexible organic light emitting display device including a flexible substrate and a wire electrically coupled to at least two components of the flexible organic light emitting display device. The flexible substrate has a curved portion bent in a bending direction. The wire has at least a portion disposed on the curved portion of the flexible substrate. The portion of the wire disposed on the curved portion has a greater length than the length of the curved portion of the flexible substrate.

In one embodiment, the flexible organic light emitting display device further includes one or more electrodes. The wire may be made of the same material as at least one electrode.

Aspects of the present invention should not be limited by the above description, and other unmentioned aspects will be clearly understood by one of ordinary skill in the art from exemplary embodiments described herein.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1A:
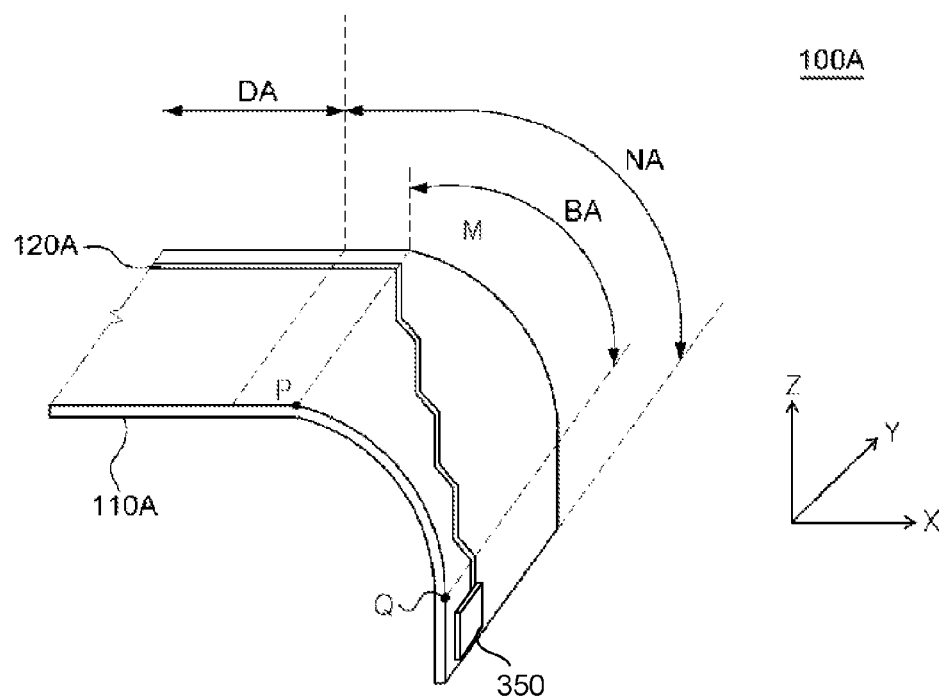
FIG. 1A is a perspective view of a flexible display substrate according to one exemplary embodiment of the present invention.

Exemplary embodiments of the present invention will be described in detail below with reference to the accompanying drawings. While the present invention is shown and described in connection with exemplary embodiments, it should be appreciated that the invention is not so limited and various modifications can be made without departing from the scope of the invention. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" another element, it can be directly on the other element or intervening elements may also be present. In contrast, when an element is referred to as being "directly on" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Further, it will be understood that when an element is referred to as being "overlapped" with another element, one element can be positioned above the other element or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

In this specification, an organic light emitting display device with a top emission mode refers to an organic light emitting display device, wherein light emitted from the organic light emitting diode radiates from an upper portion of the organic light emitting display device. That is, the organic light emitting display device with a top emission mode refers to an organic light emitting display device, wherein light emitted from the organic light emitting diode radiates in a direction of a top surface of a substrate having a thin film transistor formed therein for driving the organic light emitting display device.

In this specification, an organic light emitting display device with a bottom emission mode refers to an organic light emitting display device, wherein the light emitted from the organic light emitting diode radiates from a lower portion of the organic light emitting display device. That is, the organic light emitting display device with a bottom emission mode refers to an organic light emitting display device, wherein light emitted from the organic light emitting diode radiates in a direction of a bottom surface of a substrate having a thin film transistor formed therein for driving the organic light emitting display device.

In this specification, an organic light emitting display device with a dual emission mode refers to an organic light emitting display device, wherein light emitted from the organic light emitting diode radiates from upper and lower portions of the organic light emitting display device. In this specification, in the organic light emitting display devices with top, bottom, and dual emission modes, a thin film transistor, an anode, and a cathode are disposed to optimize a configuration of each emission mode, thereby optimally disposing the thin film transistor without interfering with an emission direction of a light emitting element.

In this specification, a flexible display device refers to a display device having a various degrees of flexibility, and may be used to have the same meaning as a bendable display device, a rollable display device, an unbreakable display device, or a foldable display device. In this specification, a flexible organic light emitting display device is one example of various flexible display devices.

In this specification, a transparent display device refers to a transparent display device that is at least a part of a screen of a display device viewed by a user. In this specification, transparency of the transparent display device refers to a degree of transparency at which a user at least recognizes an object behind a display device. In this specification, the transparent display device includes a display area and a non-display area. The display area is an area on which an image is displayed, and the non-display area is an area on which no image is displayed, such as a bezel area. To maximize transmittance of the display area, the transparent display device is configured to dispose opaque components, such as a battery, a printed circuit board (PCB), and a metal frame, under the non-display area rather than the display area. In this specification, the transparent display device refers to a transparent display device whose transmissivity is, for example, equal to or greater than at least 20%. In this specification, the term "transmissivity" means a value obtained by dividing an intensity of light, which passes through the transparent display device except for light which is incident on a transmissive region of the transparent display device and reflected on the interface between respective layers of the transparent display device, by an intensity of the entire incident light.

In this specification, front and rear surfaces of the transparent display device are defined based on light emitted from the transparent display device. In this specification, the front surface of the transparent display device means a surface on which light from the transparent display device is emitted, and the rear surface of the transparent display device means a surface opposite to the surface on which the light from the transparent display device is emitted.

The features of various exemplary embodiments of the present invention may be partially or entirely bound or combined with each other, and be technically engaged and driven using various methods as apparent to those skilled in the art, and the exemplary embodiments may be independently practiced alone or in combination.

Hereinafter, various exemplary embodiments of the present invention will be described in further detail with reference to the accompanying drawings.

Figure 1B:
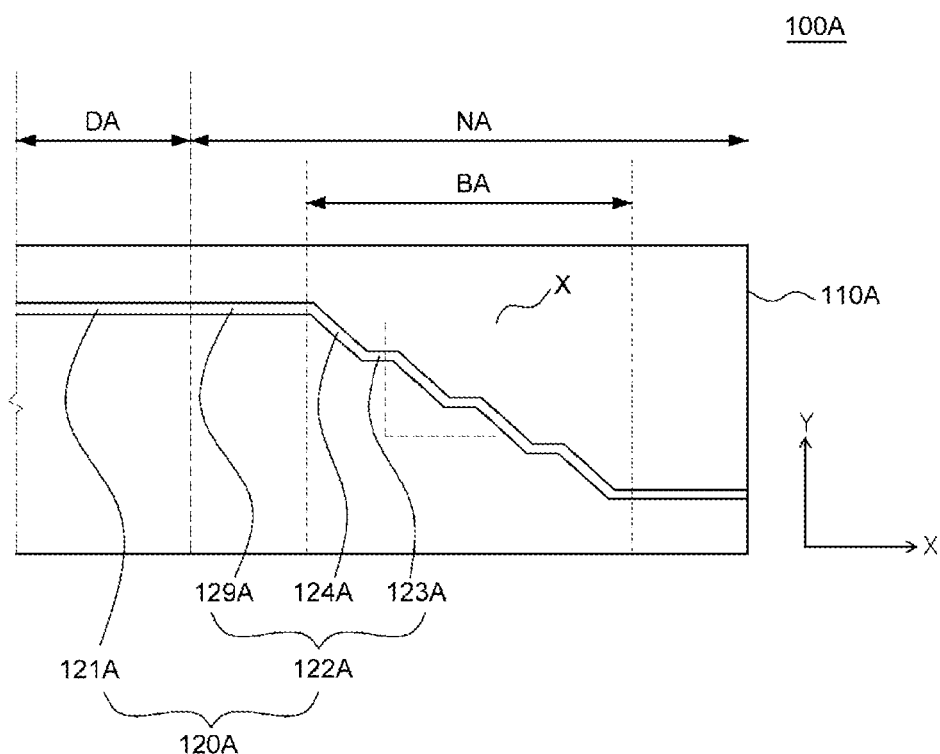
FIG. 1B is a top view showing an unbent state of a flexible display substrate according to one exemplary embodiment of the present invention.

FIG. 1A is a perspective view of a flexible display substrate 100A, according to one exemplary embodiment of the present invention. FIG. 1B is a top view showing an unbent state of the flexible display substrate 100A according to one exemplary embodiment of the present invention. Referring to FIGS. 1A and 1B, a flexible display substrate 100A includes a flexible substrate 110A and a wire 120A.

The flexible substrate 110A is a substrate configured to support various components of the flexible display. Here, the flexible substrate 110A is endowed with flexibility. The flexible substrate 110A may also be referred to as a flexible substrate, a first flexible substrate, or a flexible member. When the flexible substrate 110A is formed of a plastic, the flexible substrate 110A may also be referred to as a plastic film, a plastic substrate, or a first flexible substrate. FIGS. 1A and 1B show that the flexible substrate 110A is illustrated in the form of a rectangular shape. However, it should be understood that the flexible substrate 120 may have various shapes, but the present invention is not limited thereto.

The flexible substrate 110A may be formed of a flexible material. For example, the flexible substrate 110A may be any one or more of materials including, but not limited to, a polyester-based polymer, a silicone-based polymer, an acrylic polymer, a polyolefin-based polymer, and a copolymer thereof. More particularly, the flexible substrate 110A may be formed of one or combination of materials such as polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmethacrylate, a cyclic olefin copolymer (COC), a cyclic olefin polymer (COP), polyethylene (PE), polypropylene (PP), polyimide (PI), polymethylmethacrylate (PMMA), polystyrene (PS), polyacetal (POM), polyether ether ketone (PEEK), polyestersulfone (PES), polytetrafluoroethylene (PTFE), polyvinylchloride (PVC), polycarbonate (PC), polyvinylidenefluoride (PVDF), a perfluoroalkyl polymer (PFA), a styrene acrylonitrile copolymer (SAN), and a combination thereof. In some exemplary embodiments in which the flexible display substrate 100A may be formed of a transparent flexible material depending on the application of the display substrate 100A as well as the type of the display device employing the display substrate 100A.

The flexible substrate 110A includes a display area "DA" and a non-display area "NA." The display area "DA" of the flexible substrate 110A refers to an area on which an image is actually displayed, and the non-display area "NA" of the flexible substrate 110A refers to an area on which no image is displayed.

The non-display area "NA" of the flexible substrate 110A is an area extending from the display area "DA" of the flexible substrate 110A. The non-display area "NA" of the flexible substrate 110A extends from one side of the display area "DA" of the flexible substrate 110A. For example, the display area "DA" of the flexible substrate 110A may be formed in a polygonal shape, and the non-display area "NA" of the flexible substrate 110A may extend from one side of the display area "DA" of the flexible substrate 110A. For the sake of convenience of description, FIGS. 1A and 1B show that the non-display area "NA" of the flexible substrate 110A extends from one side of the display area "DA" of the flexible substrate 110A, but the present invention is not limited thereto. For example, the non-display areas "NA" of the flexible substrate 110A may extend from a plurality of sides of the display area "DA" of the flexible substrate 110A.

The non-display area "NA" of the flexible substrate 110A is positioned at a peripheral or edge portion of the display area "DA" of the flexible substrate 110A, and various circuits for displaying an image are disposed on the non-display area "NA" of the flexible substrate 110A. Therefore, the non-display area "NA" of the flexible substrate 110A may also be referred to as a peripheral area, a peripheral circuit area, an edge area, or a bezel area.

A display unit may be disposed at all or part of the display area "DA" of the flexible substrate 110A. The display unit is an element configured to actually display an image, and may also be referred to as an image display unit or a display panel. The display unit may be used without limitation as long as it can be configured to display an image. In this specification, however, the display unit that employs an organic light emitting diode, in which an image is displayed through an organic light emitting layer will be used as an example.

Various elements on which no image is displayed may be disposed at the non-display area "NA" of the flexible substrate 110A. The elements disposed at the non-display area "NA" of the flexible substrate 110A may include various ICs such as gate driver ICs or data driver ICs, and drive circuit units. Here, the various ICs and drive circuit units may be embedded in the flexible substrate 110A using a gate-in-panel (GIP) method, or be connected to the flexible substrate 110A using a tape-carrier-package (TCP) or chip-on-film (COF) method.

At least some portion of the display area "DA" is formed in a flat area. Here, the flat area of the substrate needs not be perfectly flat, but it is sufficient that the flat area is formed to extend along a plane. Also, at least some portion of the non-display area "NA" of the flexible substrate 110A is formed is formed in the bending area that is bent away from the plane. Accordingly, at least some portion of the non-display area "NA" of the flexible substrate 110A curved in the bending direction may be referred to as a bending area "BA" or a "curved portion." Since the non-display area "NA" of the flexible substrate 110A is not an area on which an image is displayed, an image does not need to be viewed from a top surface of the flexible substrate 110A, and at least a part of the non-display area "NA" of the flexible substrate 110A may be bent. FIGS. 1A and 1B show that only a part of the non-display area "NA" of the flexible substrate 110A is a bending area "BA" for the sake of convenience of description. However, to minimize a size of the non-display area "NA" of the flexible substrate 110A which may be viewed from the top surface of the flexible substrate 110A, the entire non-display area "NA" of the flexible substrate 110A may correspond to a bending area "BA". In FIG. 1A, the bending area of the flexible substrate 110A is curved such that it is eventually extended in an angle of approximately 90° from the flat area of the substrate. That is, the bending area is bent in an axial direction in such a way that one end of the bending area is positioned perpendicular with respect to the other end of the bending area. The degree of curvature at the bending area, however, may vary according to design and/or application of the flexible display substrate 100A and the flexible organic light emitting display device in which the flexible display substrate 100A is used. For example, the bending area "BA" of the flexible substrate 110A may be bent at an angle of approximately 180° in some embodiments. For the sake of convenience of description, a part of the display area "DA" of the flexible substrate 110A is also shown in FIGS. 1A and 1B. Therefore, it was shown that the non-display area "NA" of the flexible substrate 110A has a larger width than the display area "DA" of the flexible substrate 110A. In fact, the non-display area "NA" of the flexible substrate 110A may correspond to an area that is significantly smaller than the display area "DA" of the flexible substrate 110A.

The bending area "BA" that is at least a part of the non-display area "NA" of the flexible substrate 110A is bent in a bending direction. As illustrated in FIG. 1B, the "bending direction" refers to the direction of a line extending from one point on the flexible substrate to another point on the flexible substrate (e.g., "P" and "Q" shown in FIG. 1A).

Accordingly, in FIG. 1B illustrating the flexible substrate 110A is being in a flat state (i.e., not bent), the straight line extending between a point in a non-bending area and a point in a bending area the two points (P, Q) along the curvature is referred as the "bending direction." Using the XYZ coordinate system, a point (P) that is in the display area "DA" of the flexible substrate 110A is defined as a starting point, and a straight line extended to "Q" on the flexible substrate 110A is defined as the X axis, a straight line perpendicular to the straight line joining the two points (P, Q) on the flexible substrate 110A and intersecting the starting point (P) is defined as the Y axis, and a straight line perpendicular to an XY plane on which the X axis and the Y axis on the flexible substrate 110A are formed and intersecting the starting point (P) is defined as the Z axis. Even when the flexible substrate 110A is bent as shown in FIG. 1A, the direction which is indicated by a line joining the two points (P, Q), which is the vector between the two points projected on the XY plane, is defined as the "bending direction" in the present disclosure. Accordingly, in the example illustrated in FIGS. 1A and 1B, the bending direction refers to an X axis direction in reference to the XYZ coordinate system shown in FIG. 1A, which can be also indicated by a unit vector (1, 0, 0).

A wire 120A is formed on the flexible substrate 110A. The wire 120A may electrically connect to a display unit, which may be formed on the display area "DA" of the flexible substrate 110A, with a drive circuit unit 350, a gate driver IC, or a data driver IC, which may be formed on the non-display area "NA" of the flexible substrate 110A, to send a signal. The wire 120A may be formed of a conductive material. In particular, the wire 120A may be formed of a conductive material having excellent flexibility so as to minimize generation of cracks upon bending the flexible substrate 110A. For example, the wire 120A may be formed of a conductive material having excellent flexibility, such as gold (Au), silver (Ag), and aluminum (Al). However, the constituent material of the wire 120A is not particularly limited, and may be one of various conductive materials used to manufacture a display unit. More particularly, the wire 120A may be formed of one of various materials used to manufacture a display unit, for example, molybdenum (Mo), chromium (Cr), titanium (Ti), nickel (Ni), neodymium (Nd), copper (Cu), and a an alloy of silver (Ag) with magnesium (Mg). Also, the wire 120A may be formed in a multilayer structure including the various conductive materials as described above. For example, the wire 120A may be formed in a three-layer structure of titanium (Ti), aluminum (Al), and titanium (Ti), but the present invention is not limited thereto.

The wire 120A includes a first wire 121A formed on the display area "DA" of the flexible substrate 110A, and a second wire 122A formed on the non-display area "NA" of the flexible substrate 110A and electrically connected to the first wire 121A. The first wire 121A and the second wire 122A may be electrically connected through contact at the boundary between the display area "DA" of the flexible substrate 110A and the non-display area "NA" of the flexible substrate 110A. The first wire 121A is electrically connected to the display unit at the display area "DA" of the flexible substrate 110A, and the second wire 122A is electrically connected to the drive circuit unit, the gate driver IC, or the data driver IC at the non-display area "NA" of the flexible substrate 110A. As a result, the wire 120A may electrically connect the display unit with the drive circuit unit, the gate driver IC, or the data driver IC.

The second wire 122A includes a first portion 123A extending in a first direction bending direction and a second portion 124A extending in a second direction. Here, the first direction and the second direction refer to different directions from each other. In some embodiments, the first direction is substantially the same as the bending direction. In other words, the first direction is substantially perpendicular to a boundary line between the substantially flat area and the bending area. It should be noted that the first direction doesn't have to be exactly same as the bending direction or exactly perpendicular to the boundary line between the flat area and the bending area due to the minimal margin of errors during the formation of the wire. As shown in FIGS. 1A and 1B, when the bending area "BA" of the flexible substrate 110A corresponds to a part of the non-display area "NA" of the flexible substrate 110A, the second wire 122A may further include a connection portion 129A. However, when the bending area "BA" of the flexible substrate 110A corresponds to the entire non-display area "NA" of the flexible substrate 110A, the second wire 122A may include only a first portion 123A and a second portion 124A. For the sake of convenience of description, FIG. 1B shows that the connection portion 129A of the second wire 122A extends in the same first direction as the first portion 123A of the second wire 122A. However, the connection portion 129A of the second wire 122A may extend in a second direction, and may be a straight or oblique line extending in different directions other than the first and second directions. In addition, the connection portion 129A may be formed in various shapes.

Referring to FIGS. 1A and 1B, the first direction that is a direction in which the first portion 123A of the second wire 122A extends is the same as the bending direction, and the second direction that is direction in which the second portion 124A of the second wire 122A extends is different from the bending direction. When the flexible substrate is bent in a bending direction, a tensile force is applied to the wires formed on the flexible substrate. In particular, among the wires formed on the flexible substrate, the greatest tensile stress is applied to the wires that extend in the same direction as the bending direction, thereby causing breaking of the wires. Therefore, in the flexible display substrate 100A according to one exemplary embodiment of the present invention, the second wire 122A is not formed on the bending area "BA", which is curved portion of the flexible substrate 110A, to extend in a bending direction, but the second portion 124A of the second wire 122A may be formed to extend in the second direction which is different from the bending direction, thereby minimizing a tensile force applied to the wire 120A and minimizing breaking of the wire 120A as well.

FIGS. 1A and 1B show that the first wire 121A has the same width as the second wire 122A. In some exemplary embodiments, however, the second wire 122A may have a greater width than the first wire 121A. More particularly, the first portion 123A and the second portion 124A of the second wire 122A formed on the bending area "BA" in the second wire 122A may have a greater width than the first wire 121A. When the flexible substrate 110A is bent in a bending direction, a greater strain is applied to the first portion 123A and the second portion 124A of the second wire 122A formed on the bending area "BA", compared with the first wire 121A that is not bent. Accordingly, the strain applied to the second wire 122A may be spread over and reduced the chance of breakage by increasing the width of the first portion 123A of the second wire 122A and the second portion 124A of the second wire 122A.

To minimize the mechanical stress to the wire 120A, a length of the first portion 123A of the second wire 122A may be shorter than that of the second portion 124A of the second wire 122A so that the second wire 122A being disposed on the bending area (curved portion) of the flexible substrate 110A has more portion adapted to withstand the strain by being bent along the flexible substrate 110A. The lengths of the first portion 123A and the second portion 124A of the second wire 122A will be described in further detail with reference to FIG. 1C.

Figure 1C:
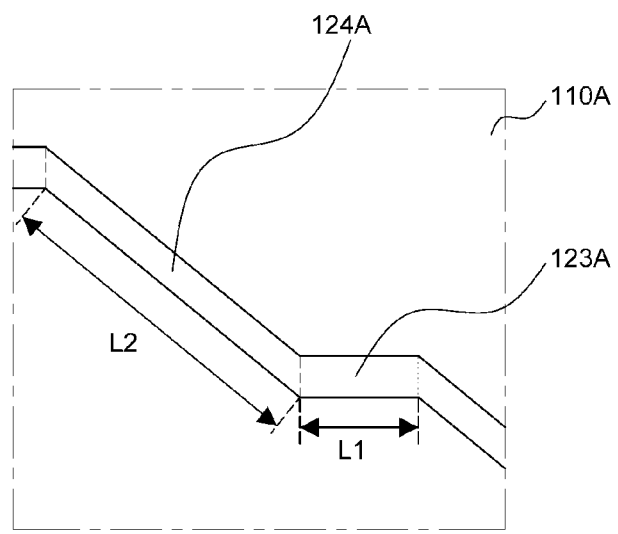
FIG. 1C is an exploded diagram of an area X shown in FIG. 1B.

FIG. 1C illustrates the area X shown in FIG. 1B. Referring to FIG. 1C, a length L1 of the first portion 123A of the second wire 122A may be shorter than a length L2 of the second portion 124A of the second wire 122A. As described above, among the wires formed on the flexible substrate, the greatest tensile force is applied to the wires extending in the same direction as the bending direction. Therefore, to minimize a tensile stress applied to the wires formed on the flexible substrate, relatively shorter wires should be formed at an area having a relatively greater tensile stress, and relatively longer wires should be formed at an area having a relatively lower tensile stress. Accordingly, in the flexible display substrate 100A according to one exemplary embodiment of the present invention, the effect of tensile force applied to the second wire 122A may be minimized and breaking of the wires may be prevented by reducing the length L1 of the first portion 123A of the second wire 122A extending in a bending direction and increasing the length L2 of the second portion 124A of the second wire 122A extending in a direction different from the bending direction.

Figure 1D:
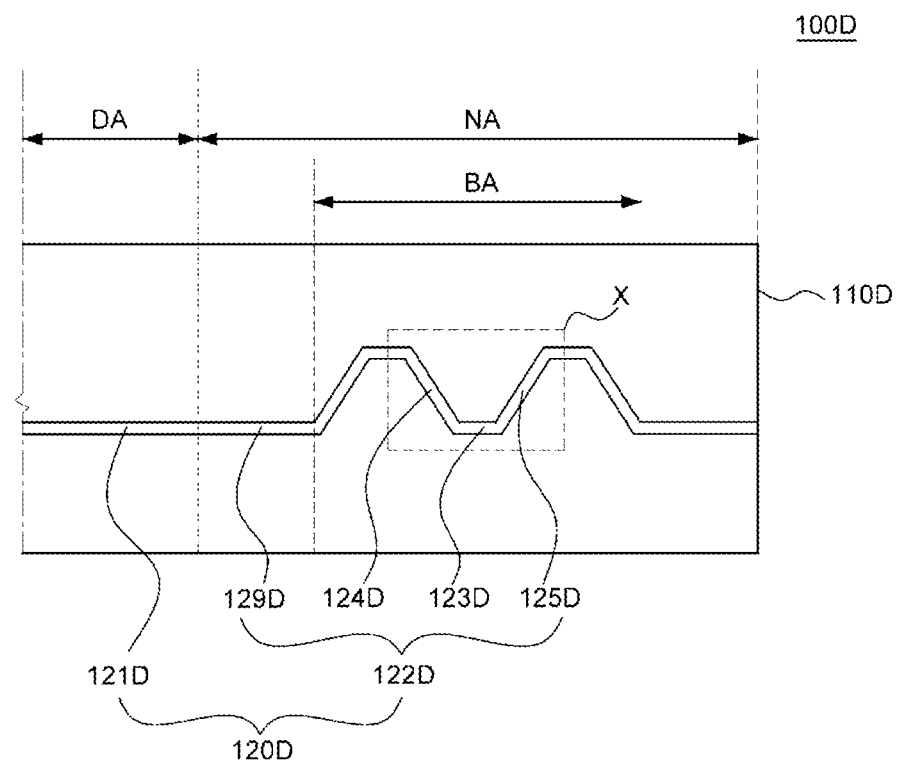
FIG. 1D is a top view showing an unbent state of a flexible display substrate according to another exemplary embodiment of the present invention.

FIG. 1D is a top view showing an unbent state of the flexible display substrate according to another exemplary embodiment of the present invention. Referring to FIG. 1D, a flexible display substrate 100D includes a flexible substrate 110D and a wire 120D. The flexible substrate 110D is substantially identical to the flexible substrate 110A shown in FIG. 1A, and thus repeated description of the flexible substrate 110D is omitted for brevity.

Referring to FIG. 1D, a second wire 122D may further include a third portion 125D formed to extend in a third direction. Here, the third direction refers to any direction different from the first and second directions. As shown in FIG. 1B, when the second wire 122A includes a first portion 123A formed to extend in a first direction and a second portion 124A formed to extend in a second direction, the second wire 122A may be continuously shifted in a second direction as the total length of the wire increases and may require increased area within the substrate. Accordingly, in the flexible display substrate according to another exemplary embodiment of the present invention, the second wire 122D further include a third portion 125D formed to extend in a direction different from the first and second directions so as to design the wire 120D in the flexible display substrate more easily.

The second wire 122D may be formed in various shapes since the second wire 122D includes a first portion 123D formed to extend in a first direction, a second portion 124D formed to extend in a second direction, and a third portion 125D formed to extend in a third direction. As shown in the exemplary embodiment in FIG. 1D, the third portion of the second wire 122D may be in the direction mirroring the second portion 124D to compensate the shift of the second wire 122D caused by the second portion 124D. While the second wire 122D may be formed in a trapezoidal wave shape as shown in FIG. 1D, it can also be formed in various other shapes such as a chopping wave shape, a sawtooth wave shape, a square wave shape, a sine wave shape, an omega ($\Omega$) shape, and a rhombus shape (e.g., diamond shape). In this case, the shape of the second wire 122D may be determined based on the bending direction of the bending area "BA" of the flexible substrate 110D, the width of the bending area "BA", the radius of curvature of the bending area "BA", the width of the wire 120D, and the total length of the wire 120D.

Figure 1E:
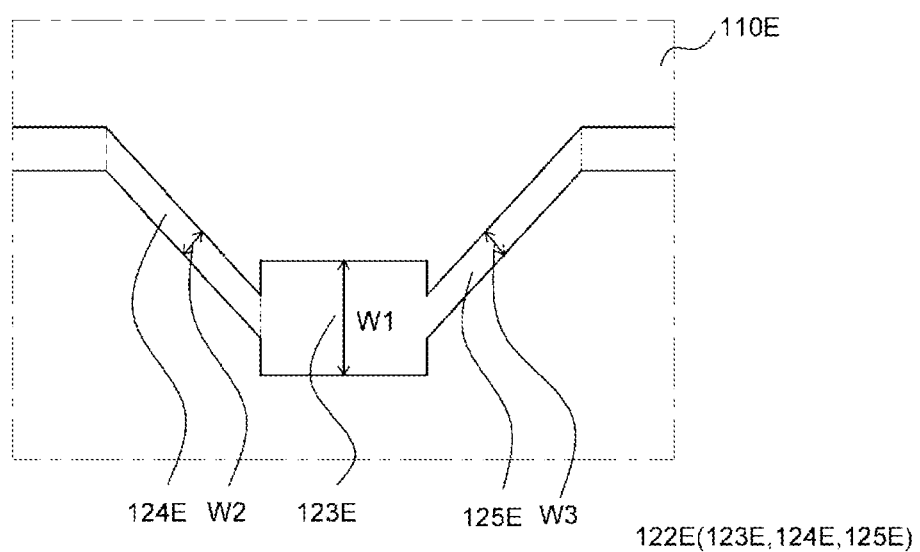
FIGS. 1E to 1G are exploded diagrams of an area X shown in FIG. 1D according to various exemplary embodiments of the present invention.
Figure 1F:
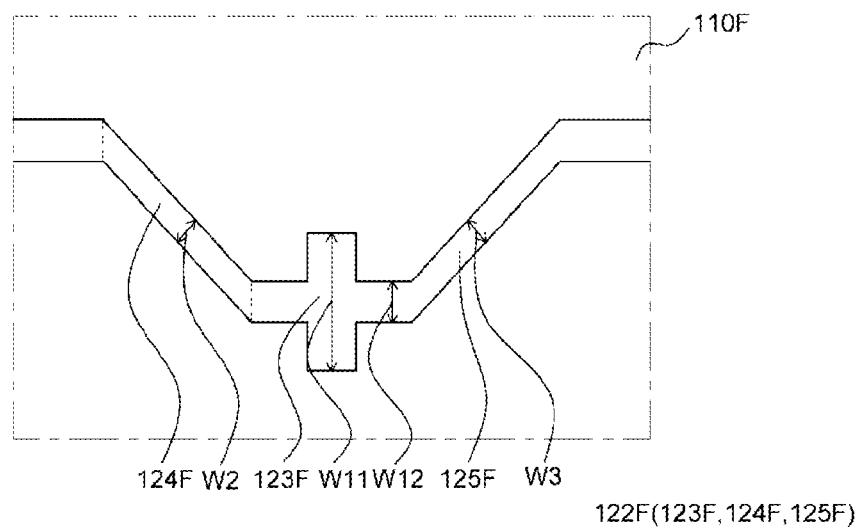
Figure 1G:
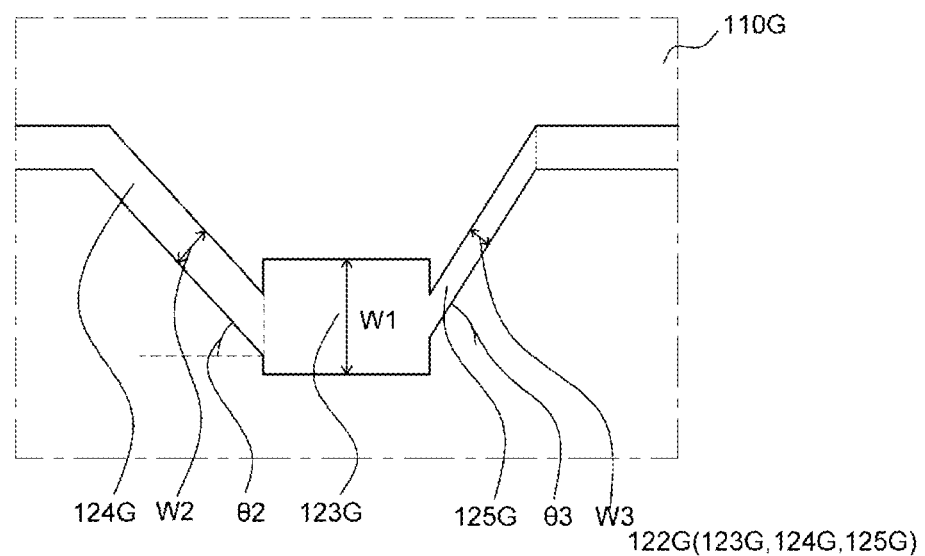

FIGS. 1E to 1G illustrate various other exemplary embodiments of the present invention. Referring to FIGS. 1E to 1G, some parts of second wires 122E, 122F, and 122G may have a width that is different from the other portions of the wire. That is, the second wires 122E, 122F, and 122G, especially, second wires 122E, 122F, and 122G formed in bending areas "BA" of flexible substrates 110E, 110F, and 110G, are not formed with uniform widths, but some selective portions of the second wire may be adjusted.

Referring to FIG. 1E, a width W1 of a first portion 123E of the second wire 122E formed to extend in a first direction may be greater than a width W2 of a second portion 124E of the second wire 122E formed to extend in a second direction and a width W3 of a third portion 125E of the second wire 122E formed to extend in a third direction. As described above, when the flexible substrate 110E is bent in a bending direction, a tensile force is applied to the second wire 122E formed on the flexible substrate 110E. In particular, it is likely that the tensile stress is greater on the first portion 123E extending in the same (or substantially same) direction as the bending direction in comparison to other portions of the second wire. Since the first portion 123E is has the higher risk of breakage, a width W1 of the first portion 123E of the second wire 122E can be selectively formed to be greater than the width W2 of the second portion 124E as well as the width W3 of the third portion 125E. Of course, it is possible to increase the widths of all portions of the second wire. However, it will inadvertently increase the resistance of the second wire as well. Accordingly, selectively increasing the width of portions that has a greater risk of breakage (e.g., the first portion 123E) can reduce the risk of disconnection without compromising the sheet resistance of the wire.

Referring to FIG. 1E, the direction of the second portion and the direction of the third portion are symmetrical to each other. That is, the second portion 124E and the third portion 125E are formed to extend in the same reference angle as shown in FIG. 1E. Assuming the tensile stress being applied to the second portion 124E and the third portion 125E is the same, the width W2 of the second portion 124E of the second wire 122E can be the same as the width W3 of the third portion 125E of the second wire 122E.

In some embodiments, a portion of the second wire 122F (e.g., the first portion 123F, second 124F and third portion 125F) can have a plurality of subsections that has different widths as illustrated in FIG. 1F. For instance, the first portion 123F of the second wire 122F can have three subsections, in which only the mid-subsection has an expanded width. Accordingly, in the flexible display substrate according to another exemplary embodiment of the present invention, breaking of wires may be prevented by forming a subsection of the first portion 123F of the second wire 122F so that a width W11 of the subsection of the first portion 123F can be greater than a width W12 of a different area of the first portion 123F of the second wire 122F which is the same as the width W2 of the second portion 124F of the second wire 122F and the width W3 of the third portion 125F of the second wire 122F. In other words, the first portion 123F of the second wire 122F can include two different subsections each having a different width. For the sake of convenience of description, FIG. 1F shows that one protrusion having a relatively greater width is present in the first portion 123F of the second wire 122F, but it should be appreciated that any number of subsections with different width may be included in the portions (e.g., first, second, third portions) of the second wire.

As such, the width W2 of the second portion 124F of the second wire 122F and/or the width W3 of the third portion 125F of the second wire 122F may also be altered at least at some points. Since the second portion 124F of the second wire 122F and the third portion 125F of the second wire 122F extend in the second and third directions different from the bending direction, a risk of breaking wires is relatively less than that of the first portion 123F of the second wire 122F. However, since a tensile force according to bending of the flexible substrate 110F is also applied to the second portion 124F and the third portion 125F of the second wire 122F, theses portions might also break due to the tensile force. Therefore, the part with increased width may be formed in the second portion 124F of the second wire 122F and/or the third portion 125F of the second wire 122F.

Subsequently, referring to FIG. 1G, the width W1 of the first portion 123G of the second wire 122G, the width W2 of the second portion 124G of the second wire 122G, and the width W3 of the third portion 125G of the second wire 122G may be different from one another. As described above, when the flexible substrate is bent in a bending direction, the greatest tensile force is applied to the wires extending in the same direction as the bending direction among the wires formed on the flexible substrate. Also, the tensile stress applied to the wires may be reduced as an angle formed between the bending direction and the direction in which the wires extend increases. Therefore, when the extended direction of the second portion 124G (i.e., reference angle from the bending direction) is different from the extended direction of the third portion 125G, as shown in FIG. 1G, the tensile force applied to the second portion 124G of the second wire 122G is different from the tensile force applied to the third portion 125G of the second wire 122G. In other words, since the reference angle θ2 with respect to the bending direction is smaller than the reference angle θ3, the tensile stress applied to the second portion 124G of the second wire 122G is greater than the tensile stress applied to the third portion 125G of the second wire 122G.

In this disclosure, the reference angle refers to an acute version of any angle determined by repeatedly subtracting or adding 180 degrees, and subtracting the result from 180 degrees if necessary, until a value between 0 degrees and 90 degrees is obtained. Therefore, stress applied to the wire 120G may be dispersed to minimize a risk of breaking wires by adopting a structure in which the portions of the wire are formed to have widths based on the intensity of the tensile stress applied to the wire 120G. For instance, the first portion 123G can be formed to have the greatest width W1, the second portion 124G can be formed to have the second greatest width W2, and the third portion 125G of the second wire 122G can be formed to have the shortest width W3 as illustrated in FIG. 1G.

Figure 1H:
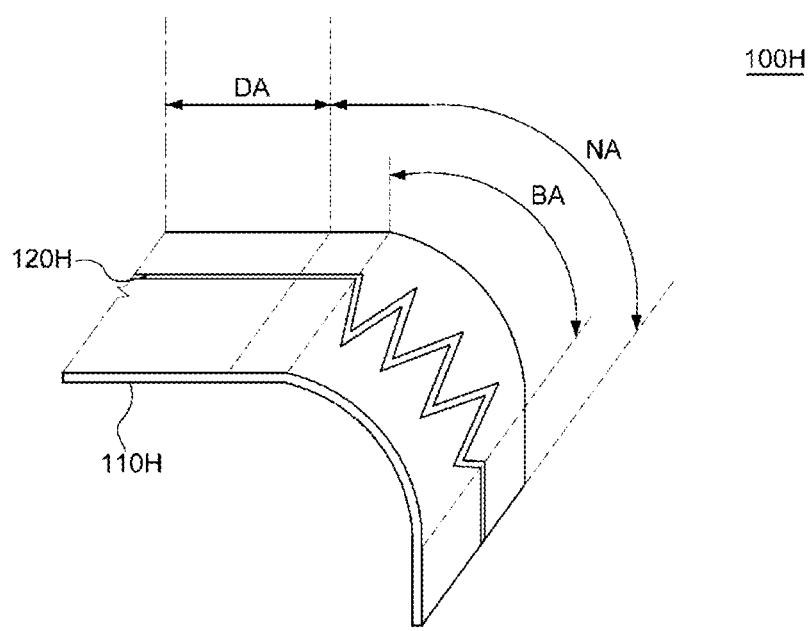
FIG. 1H is a perspective view of a flexible display substrate according to another exemplary embodiment of the present invention.
Figure 1I:
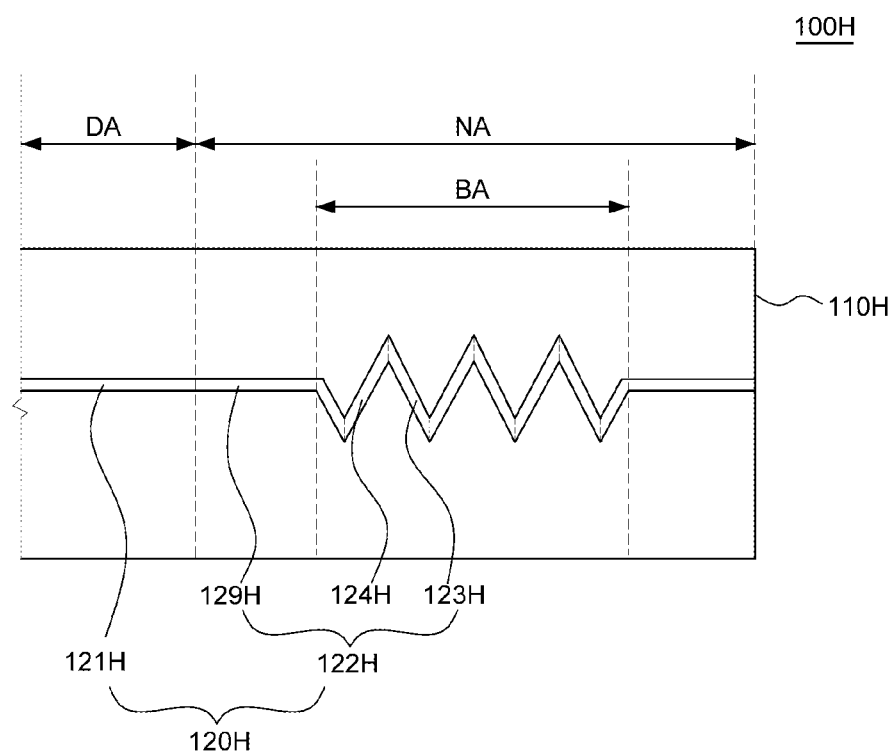
FIG. 1I is a top view showing an unbent state of a flexible display substrate according to still another exemplary embodiment of the present invention.

FIG. 1H is a perspective view of a flexible display substrate according to still another exemplary embodiment of the present invention. FIG. 1I is a top view showing an unbent state of the flexible display substrate according to still another exemplary embodiment of the present invention. Referring to FIGS. 1H and 1I, a flexible display substrate 100H includes a flexible substrate 110H and a wire 120H. The flexible substrate 110H is substantially identical to the flexible substrate 110A shown in FIGS. 1A to 1C, and thus repeated description of the flexible substrate 110H is omitted for brevity.

The wire 120H is formed on the flexible substrate 110H. The wire 120H includes a first wire 121H formed on the display area "DA" of the flexible substrate 110H, and a second wire 122H formed on the non-display area "NA" of the flexible substrate 110H and electrically connected to the first wire 121H. In at least a part of the non-display area "NA" of the flexible substrate 110H formed in a curved shape in a bending direction, that is, the bending area "BA", the second wire 122H includes a first portion 123H formed to extend in a first direction, and a second portion 124H formed to extend in a second direction. In this example, the first direction and the second direction refer to different directions, that is non-straight angle from the bending direction of the flexible substrate 110H.

Referring to FIGS. 1H and 1I, both of the first direction that is a direction in which the first portion 123H of the second wire 122H extends, and the second direction that is a direction in which the second portion 124H of the second wire 122H extends are different from the bending direction. The wire 120H is substantially identical to the wires 120A, 120D, 120E, 120F, and 120G shown in FIGS. 1A to 1G, except that the first direction that is a direction in which the first portion 123H of the second wire 122H extends is different from the bending direction, and thus repeated description of the wire 120H is omitted for brevity.

When the flexible substrate is bent in a bending direction, a tensile force is applied to the wires formed on the flexible substrate. In particular, among the wires formed on the flexible substrate, the greatest tensile force may be applied to the wires extending in the same direction as the bending direction, thereby causing breaking of the wires. Therefore, in the flexible display substrate 100H according to still another exemplary embodiment of the present invention, the second wire 122H is not formed on the bending area "BA", which is an area formed in a curved shape in the flexible substrate 110H, to extend in a bending direction, but both of the first portion 123H and second portion 124H of the second wire 122H may be formed to extend in the second and third directions which are different from the bending direction, thereby minimizing the effect of tensile force applied to the wire 120H and minimizing breaking of the wire 120H as well. Also, in some embodiments, the length of the portions can be formed differently based on the magnitude of the portion's reference angle from the bending direction. For example, the portion that is oriented in greater reference angle from the bending direction can be longer than the portion that is oriented in lesser reference angle from the bending direction, thereby reducing the portion of the wire receiving the mechanical strength from being bent.

Figure 1J:
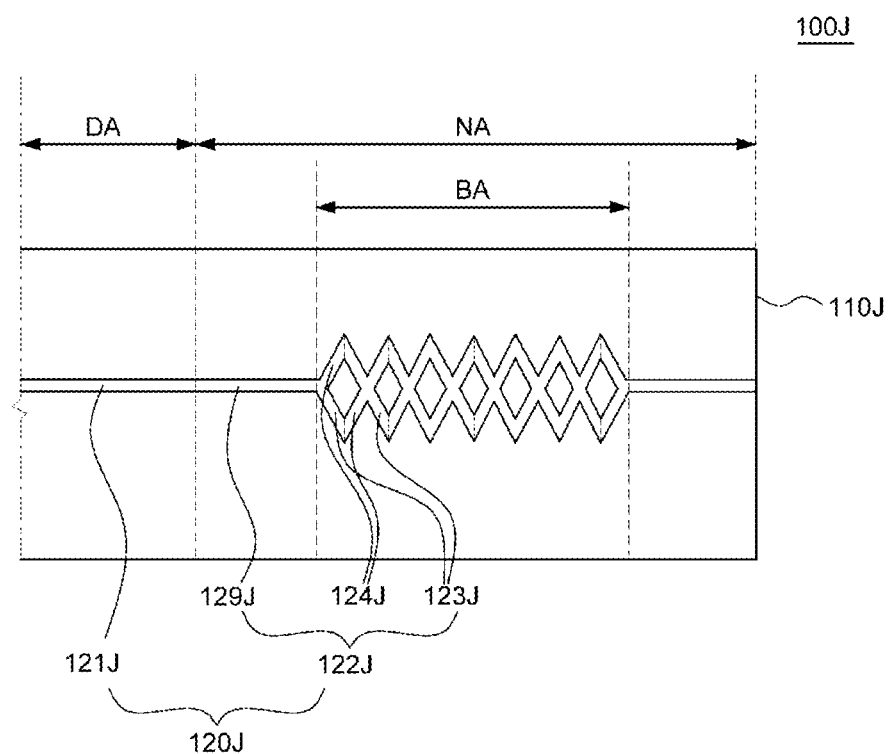
FIG. 1J is a top view showing an unbent state of a flexible display substrate according to still another exemplary embodiment of the present invention.

FIG. 1J is a top view showing an unbent state of the flexible display substrate according to still another exemplary embodiment of the present invention. Referring to FIG. 1J, a flexible display substrate 100J includes a flexible substrate 110J and a wire 120J. The flexible substrate 110J is substantially identical to the flexible substrate 110H shown in FIGS. 1H and 1I, and thus repeated description of the flexible substrate 110J is omitted for brevity.

The wire 120J is formed on the flexible substrate 110J. The wire 120J includes a first wire 121J formed on a display area "DA" of the flexible substrate 110J, and a second wire 122J formed on a non-display area "NA" of the flexible substrate 110J and electrically connected to the first wire 121J. In at least a part of the non-display area "NA" of the flexible substrate 110J curved in a bending direction, that is, the bending area "BA", the second wire 122J includes a first portion 123J formed to extend in a first direction, and a second portion 124J formed to extend in a second direction. Here, the first direction and the second direction refer to predetermined directions, that is, different directions, on the flexible substrate 110J.

Referring to FIG. 1J, the second wire 122J may be divergent at the boundary of the bending area "BA" of the flexible substrate 110J so that the first portion 123J of the second wire 122J can extend in a first direction and the second portion 124J of the second wire 122J can extend in a second direction. The second portion 124J of the second wire 122J extends from the end of the first portion 123J of the second wire 122J divergent at the boundary of the bending area "BA" of the flexible substrate 110J, and the first portion 123J of the second wire 122J extends from the end of the second portion 124J of the second wire 122J divergent at the boundary of the bending area "BA" of the flexible substrate 110J to cross the first portion 123J of the second wire 122J with the second portion 124J of the second wire 122J. Accordingly, the second wire 122J may extend along the outline of rhombuses (e.g., diamond shapes) connected to each other in a bending area of the flexible substrate 110J. In this way, the portions of the wire can form a network, which can provide multiple routes for the electrical signal via the wire. Even when one portion of the wire is cracked or otherwise disconnected from the other portion, the electrical signal can reach from one end to the other end via the remaining portions of the wire.

For the sake of convenience of description, FIG. 1J shows that the second wire 122J is divergent at the boundary of the bending area "BA" of the flexible substrate 110J, but the present invention is not limited thereto. For example, the second wire 122J may be divergent in the bending area "BA" of the flexible substrate 110J. Also, some portions of the second wire 122J may be formed in a layer different from the other portions of the wire. For instance, the portions 124J may be formed in the first layer (e.g., inner layer) while the portions 123J are formed in the second layer (e.g., outer layer) of substrate. When the portions formed in the outer layer are likely to be affected more by the bending stress, the portions in the outer layer may be formed to extend in greater reference angle from the bending direction or formed to have greater width than the portions in the inner layer. Of course, the length, width and orientation of the wire portions can vary according to their layer within and/or on the substrate as well as the curvature of the substrate.

Figure 1K:
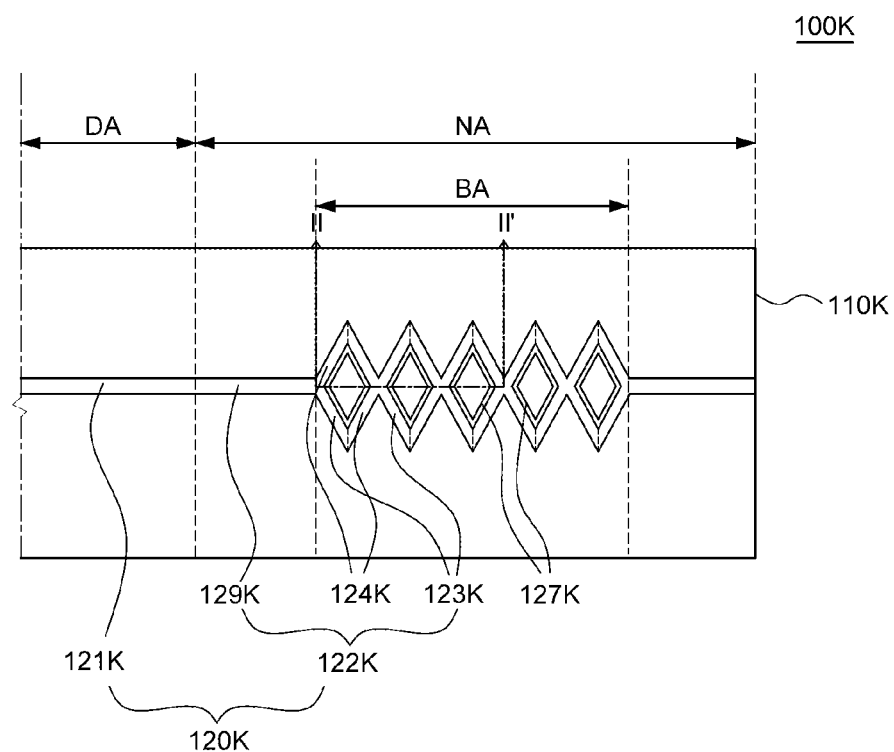
FIG. 1K is a top view showing an unbent state of a flexible display substrate according to still another exemplary embodiment of the present invention.
Figure 1L:
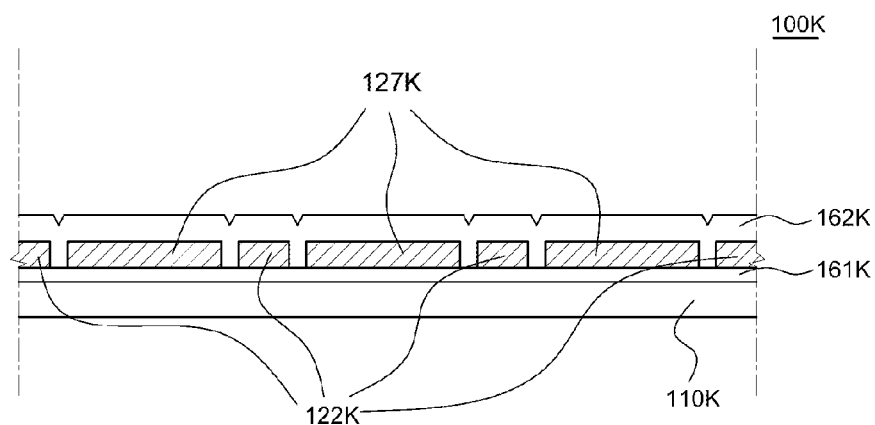
FIG. 1L is a cross-sectional view of the flexible display substrate taken along line II-II' of FIG. 1K.

FIG. 1K shows yet another embodiment of a flexible substrate that is illustrate in the unbent state, and FIG. 1L is a cross-sectional view of the line II-II' shown in FIG. 1K. As shown in FIGS. 1K and 1L, the flexible substrate 100K comprises a wire 120K, planarization members 127K, a buffer layer 161K and a passivation layer 162K. The primary function of the buffer layer 161K is to prevent permeation of moisture or other foreign particles through the substrate 110K. The buffer later 161K may also planarize the substrate 110K. In the example shown in FIG. 1K, the buffer layer 161K is formed between the substrate 110K and the wire 120K. The passivation layer 162K is another type of a protection layer, which can protect the underlying components similar to the buffer layer 161K. Depending on the type of flexible substrate 110K or the components to be disposed on the flexible substrate 110K, the buffer layer 161K and the passivation layer 162K may not be necessary in some embodiments.

Some embodiments of the flexible substrate comprise one or more planarization members 127K on the same layer as the wire 120K to create a neutral plane around the wire 120K by filling the hollow spaces around the wire 120K. Cracks of the substrate 110K and other layers on the wire 120K can be reduced by smoothening the surfaces of the other layers around the wire 120K. By smoothening the surfaces of the other layers, stress concentration in the surfaces can be reduced, thereby reducing the likelihood of cracks forming on the other layers formed on the wire 120K. In the example shown in FIG. 1K, the planarization member 127K having the same height as the wire 120K is disposed in the hollow space surrounded by the portions (123K, 124K) of the wire 120K. In embodiments employing the passivation layer 162K, the planarization member 127K may be formed between the substrate and the passivation layer 162K to reduce the chance of cracks in the passivation layer.

Also, the planarization member 127K can be formed of the same material as the wire 120K, which will simplify the fabrication process. Further, the planarization member 127K may be slightly spaced apart from the wire 120K as shown in the FIG. 1K. The distance between the planarization member 127K and the wire 120K may be formed so that the strain of the planarization member 127K will connect the portions of the wire 120K when the substrate is bent, thereby ensuring the electrical connection throughout the wire without transferring too much stress to the adjacent portions of the wire 120K. In some other embodiments, however, an insulating material may be used between the planarization member 127K and the wire 120K to electrically insulate the planarization member 127K and the wire 120K.

Figure 2A:
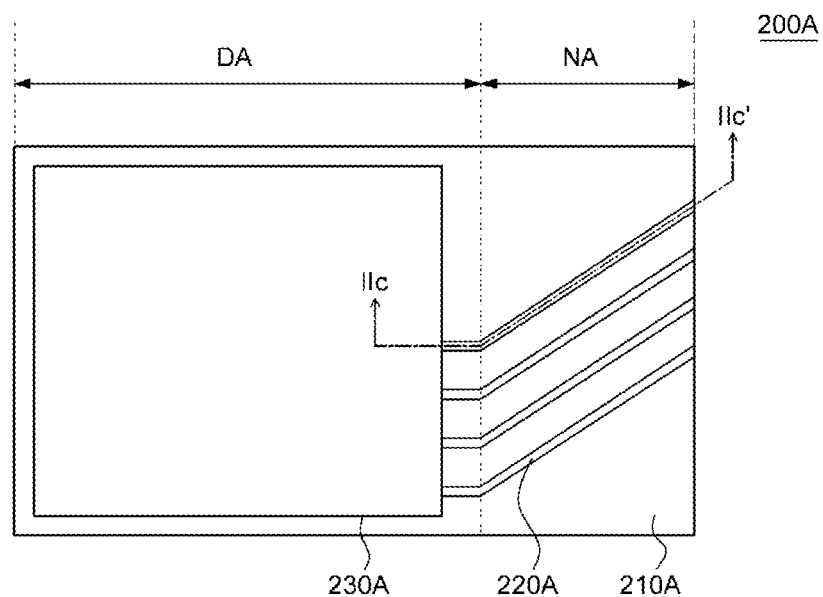
FIGS. 2A and 2B are top views of flexible organic light emitting display devices according to various exemplary embodiments of the present invention.

FIG. 2A is a top view of a flexible organic light emitting display device according to one exemplary embodiment of the present invention. Referring to FIG. 2A, a flexible organic light emitting display device 200A includes a flexible substrate 210A, a wire 220A, and a display unit 230A.

The flexible substrate 210A refers to a substrate configured to support various elements of the flexible organic light emitting display device 200A. Here, the flexible substrate 210A is endowed with flexibility. The flexible substrate 210A may also be referred to as a flexible substrate, a first flexible substrate, or a flexible member. When the flexible substrate 210A is formed of a plastic, the flexible substrate 210A formed of a plastic may also be referred to as a plastic film or a plastic substrate.

Since a non-display area "NA" of the flexible substrate 210A is positioned on a peripheral or edge portion of a display area "DA" of the flexible substrate 210A and various circuits are disposed to display an image, the non-display area "NA" of the flexible substrate 210A may also be referred to as a peripheral area, a peripheral circuit area, an edge area, or a bezel area.

The non-display area "NA" of the flexible substrate 210A includes a bending area bent in a bending direction. In FIG. 2A, the bending direction refers to a horizontal direction of the flexible substrate 210A. For the sake of convenience of description, FIG. 2A shows that the entire non-display area "NA" of the flexible substrate 210A corresponds to the bending area. However, a part of the non-display area "NA" of the flexible substrate 210A may correspond to the bending area. The flexible substrate 210A is substantially identical to the flexible substrate 110A shown in FIGS. 1A to 1C, except that the entire non-display area "NA" of the flexible substrate 210A corresponds to the bending area, and thus repeated description of the flexible substrate 210A is omitted for brevity.

A plurality of wires 220A is formed on the flexible substrate 210A. The wires 220A may electrically connect a display unit, which may be formed on the display area "DA" of the flexible substrate 210A, with a drive circuit unit, a gate driver IC, or a data driver IC, which may be formed on the non-display area "NA" of the flexible substrate 210A, to send a signal. The wires 220A may be formed of a conductive material. In particular, the wires 220A may be formed of a conductive material having excellent flexibility so as to minimize generation of cracks upon bending the flexible substrate 210A. For example, the wires 220A may be formed of a conductive material having excellent flexibility, such as gold (Au), silver (Ag), and aluminum (Al). However, the constituent material of the wires 220A is not particularly limited, and may be one of various conductive materials used to manufacture the display unit 230A. More particularly, the wires 220A may be formed of one of various materials used to manufacture a display unit, for example, molybdenum (Mo), chromium (Cr), titanium (Ti), nickel (Ni), neodymium (Nd), copper (Cu), and an alloy of silver (Ag) with magnesium (Mg).

Also, the wires 220A may be formed in a multilayer structure including the various conductive materials as described above. For example, the wires 220A may be formed in a three-layer structure of titanium (Ti), aluminum (Al), and titanium (Ti), but the present invention is not limited thereto. The wires 220A may be formed on the display area "DA" and the non-display area "NA" of the flexible substrate 210A to electrically connect the display unit 230A with the drive circuit unit, the gate driver IC, or the "Data driver IC.

At least parts of the plurality of wires 220A formed on the bending area of the flexible substrate 210A are formed in a direction non-parallel with respect to the bending direction. In the exemplary embodiment, when the bending area of the flexible substrate 210A corresponds to the entire non-display area "NA" of the flexible substrate 210A, at least parts of the plurality of wires 220A formed on the non-display area "NA" of the flexible substrate 210A may be formed transversal to the bending direction (e.g., in the slanted direction as shown in FIG. 2a). For the sake of convenience of description, FIG. 2A shows that the plurality of wires 220A formed on the non-display area "NA" of the flexible substrate 210A are formed in a slanted direction. In this specification, the term "slanted direction" refers to a direction which is neither parallel with a bending direction nor perpendicular to the bending direction. Since the bending direction refers to a horizontal direction of the flexible substrate 210A as shown in FIG. 2A, the slanted direction means a direction which is neither parallel with the horizontal direction of the flexible substrate 210A nor perpendicular to the horizontal direction of the flexible substrate 210A.

As described above, when the flexible substrate is bent in a bending direction, a tensile force is applied to the wires formed on the flexible substrate. In particular, among the wires formed on the flexible substrate, the greatest tensile force is applied to the wires extending in the same direction as the bending direction, thereby causing breaking of the wires. Therefore, in the flexible organic light emitting display device 200A according to one exemplary embodiment of the present invention, the wires 220A are not formed on the bending area of the flexible substrate 210A to extend in a bending direction, but at least parts of the wires 220A may be formed to extend in an slanted direction which is different from the bending direction, thereby minimizing a tensile stress applied to the wires 220A and minimizing breaking of the wires 220A as well.

The plurality of wires 220A positioned on the bending area of the flexible substrate 210A may be formed in various shapes. For example, the plurality of wires 220A positioned on the bending area of the flexible substrate 210A may be formed in a trapezoidal wave shape, and also formed in various shapes such as a chopping wave shape, a sawtooth wave shape, a sine wave shape, an omega (Ω) shape, and a lozenge shape. Also, the shape of the second wire 222A may be determined based on the bending direction of the bending area of the flexible substrate 210A, the width of the bending area, the radius of curvature of the bending area, the widths of the wires 220A, and the total length of the wires 220A. Additional embodiments of the shapes of the wires 220A will be described with reference to FIG. 2B.

Figure 2B:
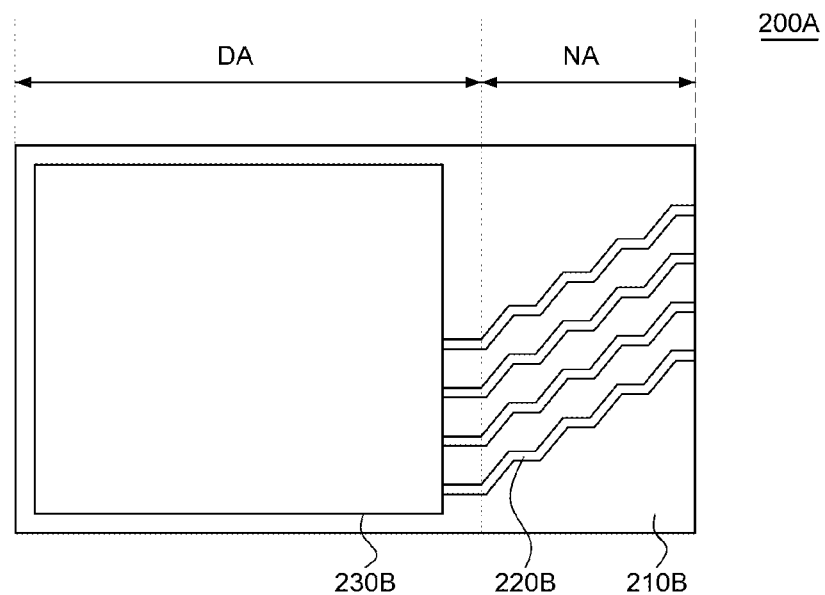

FIG. 2B is a top view of a flexible organic light emitting display device according to another exemplary embodiment of the present invention. Referring to FIG. 2B, a flexible organic light emitting display device 200B includes a flexible substrate 210B, a wire 220B, and a display unit 230B. The flexible substrate 210B and the display unit 230B are substantially identical to the flexible substrate 210A and the display unit 230A shown in FIG. 2A, and thus repeated description of the flexible substrate 210B and the display unit 230B is omitted for brevity.

A plurality of wires 220B are formed on the flexible substrate 210B. Referring to FIG. 2B, parts of the plurality of wires 220B positioned on a bending area of the flexible substrate 210B are formed in an oblique direction. As described above, when the bending area of the flexible substrate 210B corresponds to the entire non-display area "NA" of the flexible substrate 210B, parts of the plurality of wires 220B positioned on the non-display area "NA" of the flexible substrate 210B are formed in a slanted direction.

Referring again to FIG. 2A, the display unit 230A is disposed on all or part of the display area "DA" of the flexible substrate 210A. The display unit 230A is an element configured to actually display an image, and may also be referred to as an image display unit or a display panel. The display unit 230A includes an organic light emitting diode 250A and a thin film transistor 240A. The display unit 230A and the wires 220A will be described in further detail with reference to FIG. 2C.

Figure 2C:
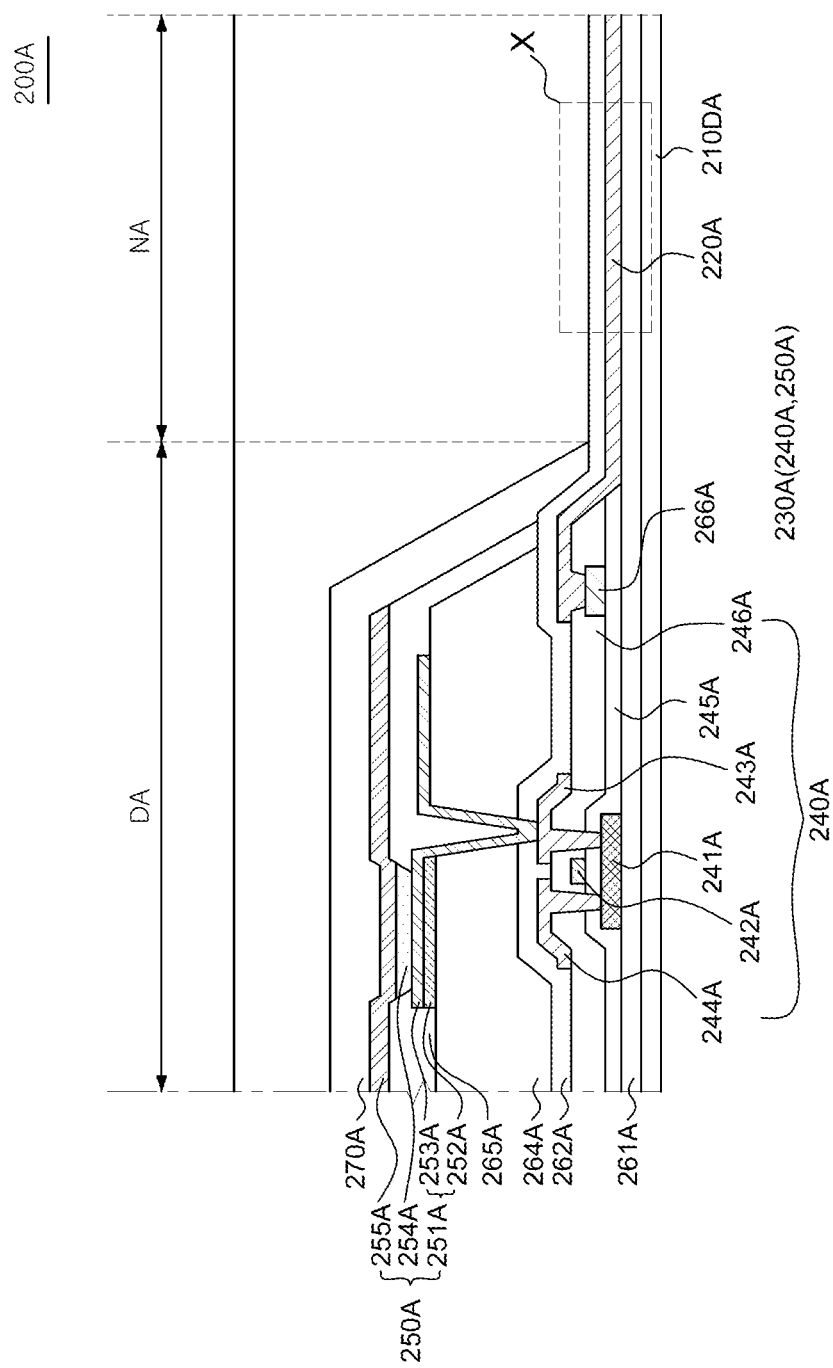
FIGS. 2C to 2E are cross-sectional views of the flexible organic light emitting display devices according to various exemplary embodiments of the present invention, taken along line IIc-IIc' of FIG. 2A.

FIG. 2C is a cross-sectional view of the flexible organic light emitting display device according to one exemplary embodiment of the present invention, taken along line IIc-IIc' of FIG. 2A.

A buffer layer 261A is formed on the flexible substrate 210A. The buffer layer 261A may serve to prevent penetration of moisture or impurities through the flexible substrate 210A and planarize a surface of the flexible substrate 210A. However, the buffer layer 261A is not an essentially required configuration, and may be selected according to the kind of the flexible substrate 210A or the kind of the thin film transistor 240A used in the flexible organic light emitting display device 200A. When the buffer layer 261A is used as shown in FIG. 2C, the buffer layer 261A may be formed of a silicon oxide film, a silicon nitride film, or a multilayer film thereof.

The silicon oxide film and the silicon nitride film constituting the buffer layer 261A have poorer flexibility than a metal. Therefore, in the flexible organic light emitting display device according to another exemplary embodiment of the present invention, the buffer layer 261A may be formed only on the display area "DA" of the flexible substrate 210A so as to ensure the flexibility of the non-display area "NA" of the flexible substrate 210A. However, when the buffer layer 261A is formed only on the display area "DA" of the flexible substrate 210A, and is not formed on the non-display area "NA" of the flexible substrate 210A, the elements positioned on an upper portion of the non-display area "NA" of the flexible substrate 210A may be susceptible to moisture and oxygen penetrating from a lower portion of the non-display area "NA" of the flexible substrate 210A. Therefore, as shown in FIG. 2C, the buffer layer 261A formed on the non-display area "NA" of the flexible substrate 210A may be thinner than the buffer layer 261A formed on the display area "DA" of the flexible substrate 210A. In this case, the buffer layers 261A may be formed on the display area "DA" and the non-display area "NA" of the flexible substrate 210A to have the same thickness, and the buffer layer 261A having a relatively smaller thickness may then be formed by etching a part of the buffer layer 261A formed on the non-display area "NA" of the flexible substrate 210A.

Also, the silicon oxide film constituting the buffer layer 261A has poorer flexibility than a metal, but exhibits more excellent flexibility than the silicon nitride film. Therefore, in the flexible organic light emitting display device according to another exemplary embodiment of the present invention, among the materials constituting the buffer layer 261A, only the silicon oxide film may be formed on the non-display area "NA" of the flexible substrate 210A so as to protect the elements positioned on an upper portion of the non-display area "NA" of the flexible substrate 210A from moisture and oxygen penetrating from a lower portion of the non-display area "NA" of the flexible substrate 210A.

An active layer 241A is formed on the flexible substrate 210A. When the buffer layer 261A is not formed, the active layer 241A may be directly formed on the flexible substrate 210A. The active layer 241A may include a channel region configured to form a channel, a source region, and a drain region. Here, the source region and the drain region come in contact with a source electrode 243A and a drain electrode 244A, respectively.

The active layer 241A may include an oxide semiconductor. As a constituent material of the oxide semiconductor included in the active layer 241A, a quaternary metal oxide such as an indium tin gallium zinc oxide (InSnGaZnO)-" based material, a ternary metal oxide such as an indium gallium zinc oxide (InGaZnO)-based material, an indium tin zinc oxide (InSnZnO)-based material, an indium aluminum zinc oxide (InAlZnO)-based material, an tin gallium zinc oxide (SnGaZnO)-based material, an aluminum gallium zinc oxide (AlGaZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, and a zinc oxide (ZnO)-based material may be used. Composition ratios of elements included in the above-described material of the oxide semiconductor are not particularly limited and may be adjusted to a wide extent. For the sake of convenience of description, the active layer 241A including the oxide semiconductor has been described in this specification, but the present invention is not limited thereto. For example, the active layer 241A may include an amorphous silicon or a polycrystalline silicon.

A gate insulation layer 245A is formed on the active layer 241A. The gate insulation layer 245A serves to insulate the active layer 241A from a gate electrode 242A. The gate insulation layer 245A may be formed of a silicon oxide film, a silicon nitride film, or a multilayer film thereof, but the present invention is not limited thereto. For example, the gate insulation layer 245A may be formed of various materials. The gate insulation layer 245A may be formed on an entire front surface of the flexible substrate 210A including the active layer 241A. However, the gate insulation layer 245A may be formed only on the active layer 241A since the gate insulation layer 245A serves only to insulate the active layer 241A from the gate electrode 242A. Also, the gate insulation layer 245A may be formed on an entire front surface of the flexible substrate 210A. Also, as shown in FIG. 2C, the gate insulation layer 245A may be formed only on the display area "DA" of the flexible substrate 210A. In this case, the gate insulation layer 245A may be formed to have a contact hole configured to open a part of the active layer 241A, and the contact hole may serve to open parts of source and drain regions of the active layer 241A.

The silicon oxide film constituting the gate insulation layer 245A has poorer flexibility than a metal, but exhibits more excellent flexibility than the silicon nitride film. Therefore, in the flexible organic light emitting display device according to still another exemplary embodiment of the present invention, among the materials constituting the gate insulation layer 245A, only the silicon oxide film may be formed on the non-display area "NA" of the flexible substrate 210A so as to protect the elements positioned on an upper portion of the non-display area "NA" of the flexible substrate 210A from moisture and oxygen penetrating from a lower portion of the non-display area "NA" of the flexible substrate 210A.

The gate electrode 242A is formed on the gate insulation layer 245A. The gate electrode 242A overlaps at least a part of the active layer 241A, particularly, a channel region of the active layer 241A. The gate electrode 242A may be formed of at least one selected from the group consisting of molybdenum (Mo), aluminum (Al), chromium (Cr), gold (Au), titanium (Ti), nickel (Ni), neodymium (Nd), copper (Cu), and an alloy thereof, but the present invention is not limited thereto. For example, the gate electrode 242A may be formed of various materials. Also, the gate electrode 242A may be composed of multiple layers formed of at least one selected from the group consisting of molybdenum (Mo), aluminum (Al), chromium (Cr), gold (Au), titanium (Ti), nickel (Ni), neodymium (Nd), copper (Cu), and an alloy thereof.

An interlayer insulation film 246A is formed on the gate electrode 242A. The interlayer insulation film 246A may be formed of the same material as that of the gate insulation layer 245A, and may be formed of a silicon oxide film, silicon nitride film, or a multilayer film thereof, but the present invention is not limited thereto. For example, the interlayer insulation film 246A may be formed of various materials. The interlayer insulation film 246A may be formed to have a contact hole configured to open a part of the active layer 241A, and the contact hole may serve to open parts of source and drain regions of the active layer 241A. The interlayer insulation film 246A may be formed only on the display area "DA" of the flexible substrate 210A as shown in FIG. 2C, but may also be formed on both the display area "DA" and the non-display area "NA" of the flexible substrate 210A like the buffer layer 261A and the gate insulation layer 245A. Among the materials constituting the interlayer insulation film 246A, only the material having excellent flexibility, such as a silicon oxide film, may be formed on the non-display area "NA" of the flexible substrate 210A.

The source electrode 243A and the drain electrode 244A are formed on the interlayer insulation film 246A. The source electrode 243A and the drain electrode 244A may be electrically connected respectively to the source and drain regions of the active layer 241A through the contact hole formed in the interlayer insulation film 246A and/or gate insulation layer 245A. The source electrode 243A and the drain electrode 244A may be formed of at least one selected from the group consisting of molybdenum (Mo), aluminum (Al), chromium (Cr), gold (Au), titanium (Ti), nickel (Ni), neodymium (Nd), copper (Cu), and an alloy thereof, but the present invention is not limited thereto. For example, the source electrode 243A and the drain electrode 244A may be formed of various materials. Also, the source electrode 243A and the drain electrode 244A may be composed of multiple layers formed of at least one selected from the group consisting of molybdenum (Mo), aluminum (Al), chromium (Cr), gold (Au), titanium (Ti), nickel (Ni), neodymium (Nd), copper (Cu), and an alloy thereof.

A passivation film 262A is formed on the source electrode 243A and the drain electrode 244A. The passivation film 262A may be formed to have a contact hole configured to expose the source electrode 243A or the drain electrode 244A. The passivation film 262A is a protective layer that may be formed of the same material as that of the interlayer insulation film 246A and/or the gate insulation layer 245A, and may be composed of a single layer or multiple layers formed of at least one selected from the group consisting of a silicon oxide film and a silicon nitride film, but the present invention is not limited thereto. For example, the passivation film 262A may be formed of various materials. FIG. 2C shows that the flexible organic light emitting display device 200A includes the passivation film 262A, but it is possible to exclude the passivation film 262A since the passivation film 262A is not an essentially required configuration. The passivation film 262A may be formed on both the display area "DA" and the non-display area "NA" of the flexible substrate 210A as shown in FIG. 2C, and also be formed on the wires 220A to protect the wires 220A from the outside.

An overcoat layer 264A may be formed on the source electrode 243A and the drain electrode 244A. The overcoat layer 264A may also be referred to as a planarization film. When the passivation film 262A is formed, the overcoat layer 264A may be formed on the passivation film 262A. The overcoat layer 264A serves to planarize an upper surface of the flexible substrate 210A. Also, the overcoat layer 264A may be formed to have a contact hole configured to expose the source electrode 243A or the drain electrode 244A. The overcoat layer 264A may be formed of at least one material selected from the group consisting of an acrylic resin, an epoxy resin, a phenolic resin, a polyamide-based resin, a polyimide-based resin, an unsaturated polyester-based resin, a polyphenylene-based resin, a polyphenylene-sulfide-based resin, and benzocyclobutene, but the present invention is not limited thereto. For example, the overcoat layer 264A may be formed of various materials.

The thin film transistor 240A includes the active layer 241A, the gate insulation layer 245A, the gate electrode 242A, the interlayer insulation film 246A, the source electrode 243A, and the drain electrode 244A, all of which are formed as described above. The thin film transistor 240A may be formed on every pixel or sub-pixel region of the display area "DA" of the flexible substrate 210A, and each pixel or sub-pixel region may be independently driven. A configuration of the thin film transistor 240A is not limited to the exemplary embodiments as described above, and may be widely modified and changed into the known configurations which may be readily practiced by those skilled in the related art.

The thin film transistor 240A may be formed on the flexible substrate 210A to allow an organic light emitting layer 254A of the organic light emitting diode 250A to emit light. In general, a switching thin film transistor and a driving thin film transistor are used to allow the organic light emitting layer 254A to emit light using image information of an input data signal according to a scan signal.

The switching thin film transistor serves to send a data signal from a data wire to a gate electrode of the driving thin film transistor when a scan signal is applied from the gate wire. The driving thin film transistor serves to send an electric current, which is transmitted through a power wire by the data signal received from the switching thin film transistor, to an anode, and control light emission of the organic light emitting layer of the corresponding pixels or sub-pixels by the electric current transmitted to the anode.

The flexible organic light emitting display device 200A may further include a thin film transistor for compensation circuits, which is designed to prevent abnormal driving of the flexible organic light emitting display device 200A.

In this specification, among various thin film transistors that may be included in the flexible organic light emitting display device 200A, only the driving thin film transistor 240A is shown for the sake of convenience of description.

Structures of the thin film transistor 240A may be divided into an inverted-staggered structure and a coplanar structure according to positions of the elements constituting the thin film transistor 240A. The thin film transistor having an inverted-staggered structure refers to a thin film transistor having a structure in which a gate electrode is positioned opposite to a source electrode and a drain electrode based on an active layer, and the thin film transistor having a coplanar structure refers to a thin film transistor having a structure in which a gate electrode is positioned on the same plane as a source electrode and a drain electrode based on an active layer. In this specification, the thin film transistor 240A having a coplanar structure is shown for the sake of convenience of description, but the present invention is not limited thereto. For example, the thin film transistor having an inverted-staggered structure may also be used herein.

The organic light emitting diode 250A including an anode 251A, the organic light emitting layer 254A, and a cathode 255A is formed on the flexible substrate 210A. The organic light emitting diode 250A is driven to form an image on a principle that holes provided in the anode 251A and electrons provided in the cathode 255A are combined at the organic light emitting layer 254A to emit light.

The flexible organic light emitting display device 200A is an independent drive display device which is driven per each sub-pixel region of the display area "DA". Therefore, the thin film transistor 240A and the organic light emitting diode 250A as described above may be disposed on each sub-pixel region of the display area "DA" to allow thin film transistor 240A disposed on each sub-pixel region to independently drive the organic light emitting diode 250A.

The anode 251A is formed on the overcoat layer 264A. The anode 251A may also be referred to as a positive pole, a pixel electrode, or a first electrode. The anode 251A may be formed separately on each sub-pixel region of the display area "DA". The anode 251A may be connected to the source electrode 243A of the thin film transistor 240A via the contact hole formed in the overcoat layer 264A. In this specification, under the assumption that the thin film transistor 240A is an N-type thin film transistor, it is described that the anode 251A is connected to the source electrode 243A. However, when the thin film transistor 240A is a P-type thin film transistor, the anode 251A may also be connected to the drain electrode 244A. The anode 251A may come in direct contact with the organic light emitting layer 254A, or may be in contact and electrically connected to the organic light emitting layer 254A with a conductive material positioned therebetween.

The anode 251A is formed of a conductive material having a high work function since the anode 251A provides holes. The anode 251A may include a transparent conductive layer 253A having a high work function, and the transparent conductive layer 253A may be formed of a transparent conductive oxide (TCO), for example, indium tin oxide (ITO), indium zinc oxide (IZO), indium tin zinc oxide (ITZO), zinc oxide, or tin oxide.

As shown in FIG. 2C, when the flexible organic light emitting display device 200A is an organic light emitting display device with a top emission mode, the anode 251A includes a reflective layer 252A formed under the transparent conductive layer 253A. The organic light emitting layer 254A emits light in all directions. However, in the case of the organic light emitting display device with a top emission mode, light emitted from the organic light emitting layer 254A should be radiated from an upper portion of the organic light emitting display device. However, when the anode 251A is composed only of the transparent conductive layer 253A as described above, the light emitted from the organic light emitting layer 254A toward the anode 251A is reflected upward on the other elements positioned below the anode 251A, but may be lost as the light radiates downward to the flexible substrate 210A. In this case, optical efficiency of the organic light emitting display device may be lowered. Therefore, the anode 251A may include a separate low-resistive reflective layer 252A so as to radiate the light emitted from the organic light emitting layer 254A toward the anode 251A from an upper portion of the organic light emitting display device.

The reflective layer 252A may be formed of a conductive layer having excellent reflexibility, for example, silver (Ag), nickel (Ni), gold (Au), platinum (Pt), aluminum (Al), copper (Cu), or molybdenum/aluminum neodymium (Mo/AlNd). In this specification, it is defined that the anode 251A includes the transparent conductive layer 253A and the reflective layer 252A, but it may also be defined that the anode 251A is composed only of the transparent conductive layer 253A and the reflective layer 252A has a separate configuration. In this specification, it is also described that the anode 251A is composed of a reflective metal layer and a transparent conductive material having a high work function. However, the anode 251A may be formed of a conductive material having a high work function and exhibiting excellent reflexibility.

Although not shown in FIG. 2C, when the flexible organic light emitting display device 200A is an organic light emitting display device with a bottom emission mode, the anode 251A may be formed of only a transparent conductive material having a high work function, or may also be formed of the transparent conductive material having a high work function and a semi-transmissive metal layer positioned under the transparent conductive material so as to embody microcavities.

Among the transparent conductive layer 253A and the reflective layer 252A, both of which constitute the anode 251A, the transparent conductive layer 253A may be electrically connected to the source electrode 243A. Referring to FIG. 2C, the reflective layer 252A is formed on the overcoat layer 264A, and a contact hole is formed in the overcoat layer 264A to electrically connect the transparent conductive layer 253A with the drain electrode 244A. For the sake of convenience of description, FIG. 2C shows that the transparent conductive layer 253A is electrically connected to the source electrode 243A. However, the reflective layer 252A may be electrically connected to the source electrode 243A via the contact hole formed in the overcoat layer 264A, and the transparent conductive layer 253A may be formed on the reflective layer 252A to be electrically connected to the source electrode 243A through the reflective layer 252A.

A bank layer 265A is formed on the anode 251A and the overcoat layer 264A. The bank layer 265A serves to distinguish adjacent sub-pixel regions from each other so that the bank layer 265A can be disposed between the adjacent sub-pixel regions. Also, the bank layer 265A may be formed to open a part of the anode 251A. The bank layer 265A may be formed of an organic insulation material, for example, one material selected from the group consisting of polyimide, photoacryl, and benzocyclobutene (BCB). The bank layer 265A may be formed in a tapered shape. When the bank layer 265A is formed in a tapered shape, the bank layer 265A may be formed using a positive-type photoresist. The bank layer 265A may be formed with a predetermined thickness so as to distinguish the adjacent sub-pixel regions from each other.

As a method of displaying an image, the flexible organic light emitting display device 200A uses a method of forming an organic light emitting layer that autonomously emits red, green, and blue lights on every sub-pixel region, and a method of forming an organic light emitting layer emitting a white light on all sub-pixel regions and simultaneously applying color filters. In the case of the organic light emitting display device manufactured using the organic light emitting layer autonomously emitting the red, green, and blue lights from each of the sub-pixel regions, an organic light emitting layer emitting one of red, green, and blue lights may be formed on the anode formed on each of a red sub-pixel region, a green sub-pixel region, and a blue sub-pixel region, all of which are opened by the bank layer.

Also, the organic light emitting layers formed on the red sub-pixel region, the green sub-pixel region, and the blue sub-pixel region may be separated. In the case of the organic light emitting display device manufactured using the white organic light emitting layer and the color filter, a white organic light emitting layer may be formed on the anode formed on each of the red sub-pixel region, the green sub-pixel region, and the blue sub-pixel region, all of which are opened by the bank layer. The organic light emitting layers formed on the red sub-pixel region, the green sub-pixel region, and the blue sub-pixel region may be connected to or separated from each other. For the sake of convenience of description, the flexible organic light emitting display device 200A manufactured using the organic light emitting layer 254A autonomously emitting the red, green, and blue lights from each of the sub-pixel regions is shown in FIG. 2C. It is also shown that the organic light emitting layers 254A of the respective sub-pixel regions are not connected to each other, but the present invention is not limited thereto.

The cathode 255A is formed on the organic light emitting layer 254A. The cathode 255A may also be referred to as a negative pole, a common electrode, or a second electrode. The cathode 255A may be connected to a separate voltage wire 220A to apply the same voltage to all the sub-pixel regions of the display area "DA".

Since the cathode 255A provides electrons, the cathode 255A is formed of a material having high electric conductivity and low work function, that is, a material for cathodes. Specific materials constituting the cathode 255A may be differently selected according to an emission mode of the organic light emitting display device.

As shown in FIG. 2C, when the flexible organic light emitting display device 200A is an organic light emitting display device with a top emission mode, the cathode 255A may be formed of a metallic material having a very small thickness and a low work function. For example, when the cathode 255A is formed of a metallic material having a low work function, a metallic material such as silver (Ag), titanium (Ti), aluminum (Al), molybdenum (Mo), or an alloy of silver (Ag) with magnesium (Mg) may be formed into a thin film having a thickness of several hundreds of Å or less, for example, 200 Å or less so as to form the cathode 255A. In this case, the cathode 255A becomes a substantially semi-transmissive layer and then is used as a substantially transparent cathode. Although a material constituting the cathode 255A is a metal which is opaque and has a high reflection coefficient, the cathode 255A has such a thickness that the cathode 255A can become transparent at a certain point of time as the cathode 255A gets thinner to a thickness equal to or less than a predetermined thickness (for example, 200 Å). The cathode 255A having such a thickness may be referred to as a substantially transparent cathode. Also, carbon nanotube and graphene coming into the spotlight as new materials may also be used as the material for cathodes.

As a sealing member covering the organic light emitting diode 250A, an encapsulation unit 270A is formed on the organic light emitting diode 250A including the cathode 255A. The encapsulation unit 270A may serve to protect internal elements, such as a thin film transistor 240A and an organic light emitting diode 250A, of the flexible organic light emitting display device 200A from moisture, air, and impact provided from the outside. The encapsulation unit 270A may be formed on a display area "DA" of the flexible organic light emitting display device 200A to protect the internal elements of the flexible organic light emitting display device 200A.

The encapsulation unit 270A may have various configurations according to a method of sealing the internal elements, such as a thin film transistor 240A and an organic light emitting diode 250A, of the flexible organic light emitting display device 200A. For example, the method of sealing the flexible organic light emitting display device 200A includes methods such as metal can encapsulation, glass can encapsulation, thin film encapsulation (TFE), and face sealing.

A pad portion 266A is formed on the flexible substrate 210A. The pad portion 266A may be formed on the display area "DA" of the flexible substrate 210A. For the sake of convenience of description, FIG. 2C shows that the pad portion 266A is formed on the gate insulation layer 245A in the display area "DA" of the flexible substrate 210A, but the present invention is not limited thereto. For example, the pad portion 266A may be formed on the flexible substrate 210A or the buffer layer 261A.

The pad portion 266A shown in FIG. 2C is configured to connect a gate wire with a gate driver IC configured to apply a gate signal to the gate wire, and is formed on the same plane as the gate electrode 242A and made of the same material as that of the gate electrode 242A. In some exemplary embodiments, when the pad portion 266A is configured to connect the data wire with the data driver IC configured to apply the data signal to the data wire, the pad portion 266A may be formed on the same plane as the source electrode 243A and the drain electrode 244A and made of the same material as that of the source electrode 243A and the drain electrode 244A.

The wires 220A may electrically connect the pad portion 266A formed on the display area "DA" of the flexible substrate 210A with a drive circuit unit, a gate driver IC, or a data driver IC to send a signal. The wires 220A are formed of the same material as that of one of the gate electrode 242A, the source electrode 243A, the drain electrode 244A, the reflective layer 252A, and the cathode 255A. FIG. 2C shows that the wires 220A are formed of the same material as that of the source electrode 243A and the drain electrode 244A. However, the wires 220A may be formed of the same material as that of the gate electrode 242A, and also be integrally formed on the same plane as the pad portion 266A.

Although FIG. 2C illustrates that a wire 220A is formed of a single conductive material, the wire 220A may be formed in a multi-layer structure including various conductive materials. For example, the wire 220A may be formed in a three-layer structure of titanium (Ti)/aluminum (Al)/titanium (Ti). Further, in FIG. 2C, since the wire 220A is formed of the same material as a source electrode 243A and a drain electrode 244A, each of the source electrode 243A and the drain electrode 244A may also be formed in a three-layer structure of Ti/Al/Ti.

In some embodiments, the wire 220A may be formed in a four-layer structure in which Al/Ti/Al/Ti are sequentially stacked from a top of the wire 220A to further increase ductility of the wire 220A. Young's modulus is a value indicating ductility of a material, and is referred to as elasticity. As Young's modulus of an arbitrary material is increased, the material may be brittle. When Ti and Al are used as a configuration material of the wire 220A, since Young's modulus of Ti is larger than that of Al, the ductility of the wire 220A may be more improved when Al is located in the outermost layer of the wire 220A than when Ti is located in the outermost layer of the wire 220A. Therefore, to further increase the ductility of the wire 220A, the wire 220A may be formed in a four-layer structure in which Al/Ti/Al/Ti may be sequentially stacked from a top of the wire 220A. Further, in FIG. 2C, since the wire 220A is formed of the same material as the source electrode 243A and the drain electrode 244A, each of the source electrode 243A and the drain electrode 244A may be formed in a four-layer structure of Al/Ti/Al/Ti.

In some embodiments, to further increase the ductility of the wire 220A, copper (Cu) may be disposed in at least one side of the top and bottom of Al in the three-layer structure of Ti/Al/Ti. Specifically, the wire 220A may be formed in a five-layer structure of Ti/Cu/Al/Cu/Ti, or in a four-layer structure of Ti/Cu/Al/Ti/ or Ti/Al/Cu/Ti. Cu is a material having low Young's modulus, and significantly good ductility, and thus Cu may be disposed in at least one side of the top and bottom of Al to further increase ductility of the wire 220A. Further, in FIG. 2C, the wire 220A may be formed of the same material as the source electrode 243A and the drain electrode 244A.

In some embodiments, when the wire 220A is open in bending to prevent defusion with external environments, Ti located in the uppermost layer of the wire 220A having the three-layer structure of Ti/Al/Ti may be replaced with titanium nitride (TiNx). Further, in FIG. 2C, since the wire 220A may be formed of the same material as the source electrode 243A and the drain electrode 244A, each of the source electrode 243A and the drain electrode 244A may be formed in a three-layer structure of TiNx/Al/Ti. At this time, the TiNx located in the uppermost layer may function as a passivation layer, and thus formation of a separate passivation layer may be omitted.

FIG. 2C shows that the flexible organic light emitting display device 200A is an organic light emitting display device with a top emission mode. However, when the flexible organic light emitting display device 200A is an organic light emitting display device with a bottom emission mode, the wires 220A may be formed of the same material as that of one of the gate electrode 242A, the source electrode 243A, the drain electrode 244A, the semi-transmissive metal layer, and the cathode 255A.

Figure 2D:
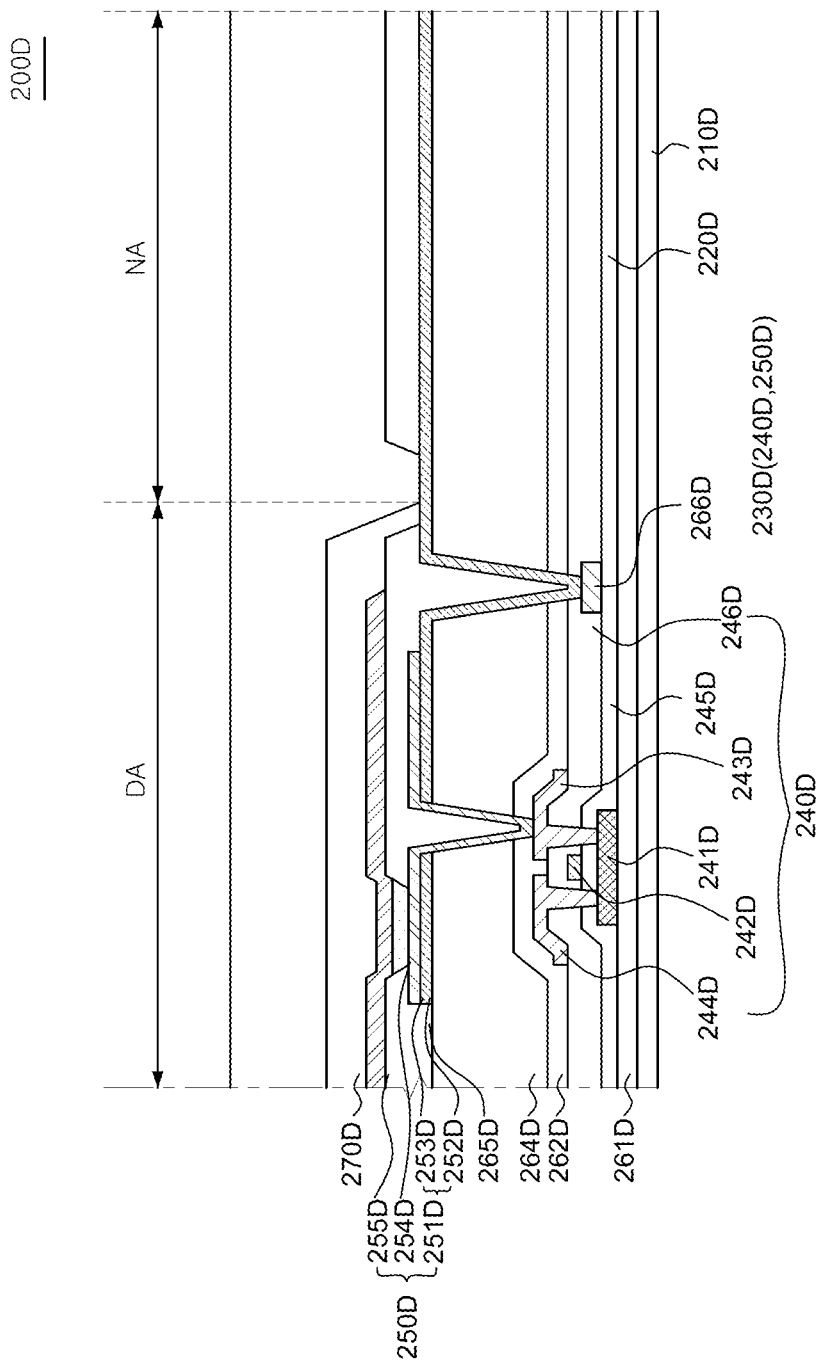

FIG. 2D is a cross-sectional view of the flexible organic light emitting display device according to still another exemplary embodiment of the present invention. Referring to FIG. 2D, a wire 220D may be formed of the same material as that of one of a gate electrode 242D, a source electrode 243D, a drain electrode 244D, a reflective layer 252D, and a cathode 255D. FIG. 2D shows that the wire 220D is formed of the same material as that of the reflective layer 252D. In general, a metal material used for the reflective layer may have excellent flexibility, compared with a metal material used for the gate electrode, the source electrode, the drain electrode, and the cathode. Therefore, in the flexible organic light emitting display device 200D according to still another exemplary embodiment of the present invention, the wire 220D may be formed of the same material as that of the reflective layer 252D to ensure flexibility of the flexible organic light emitting display device 200D, thereby reducing a risk of breaking the wire 220D. When the wire 220D is formed of the same material as that of the reflective layer 252D as shown in FIG. 2D, a bank layer 265D may be formed on the wire 220D to protect the wire 220D formed on a non-display area "NA" of a flexible substrate 210D.

Figure 2E:
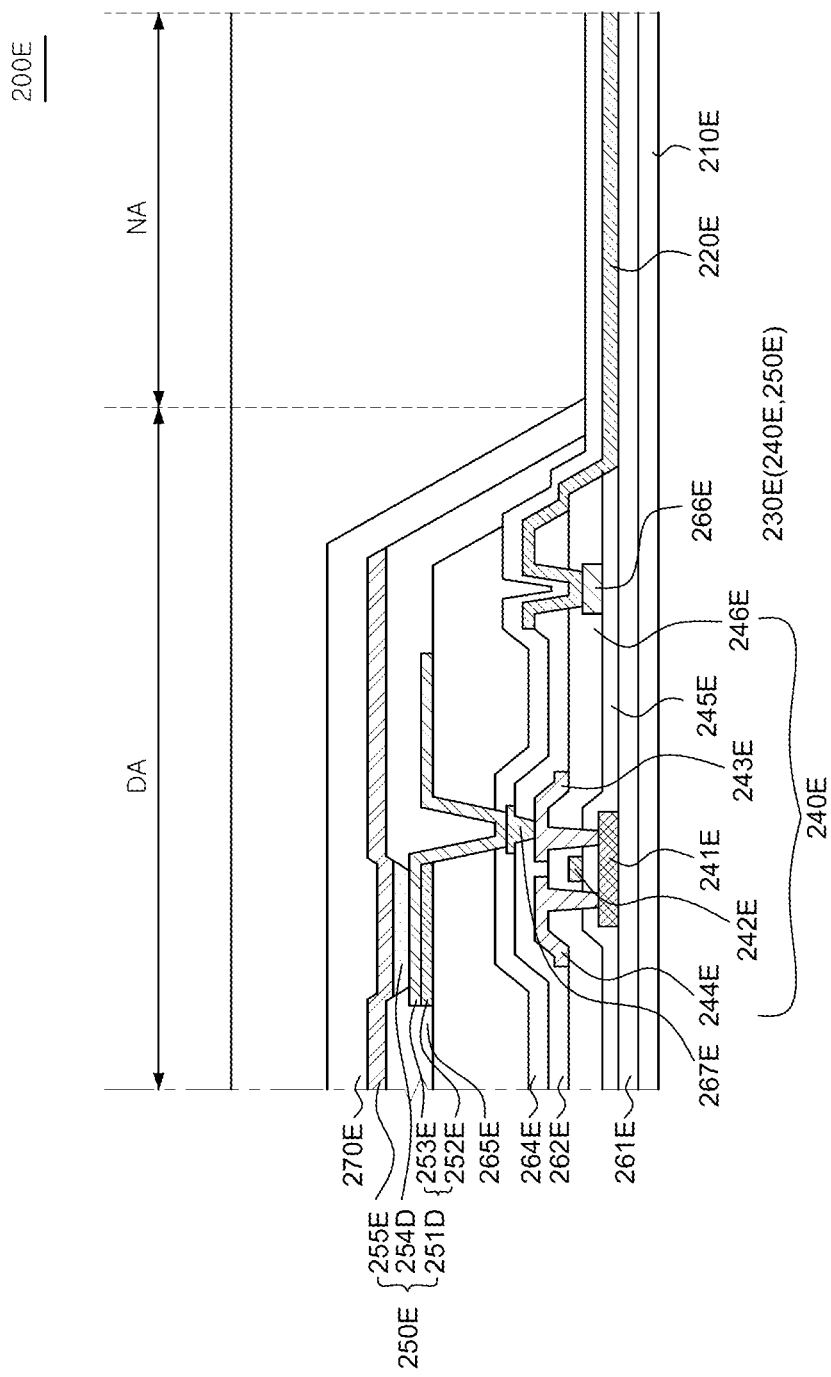

FIG. 2E is a cross-sectional view of the flexible organic light emitting display device according to still another exemplary embodiment of the present invention. Referring to FIG. 2E, a metal layer 267E may be formed between a source electrode 243E and an anode 251E. The metal layer 267E may be formed of a conductive material having excellent flexibility. The metal layer 267E may be formed between the source electrode 243E and the anode 251E, and come in contact with the source electrode 243E and the anode 251E to provide electrical connection between the source electrode 243E and the anode 251E. As the metal layer 267E is further formed, a flexible organic light emitting display device 200E includes a first passivation film 262E and a second passivation film 263E.

A wire 220E may be formed of the same material as that of the metal layer 267E. In the case of a gate electrode 242E, a source electrode 243E, and a drain electrode 244E used in a thin film transistor 240E, and a reflective layer 252E, a semi-transmissive metal layer, and cathode 255E used in an organic light emitting diode 250E, since functions of the corresponding configuration should be executed at the thin film transistor 240E or the organic light emitting diode 250E, a constituent material is restrictedly selected, and the other factors including flexibility should be considered to select the constituent material. Accordingly, in the flexible organic light emitting display device 200E according to still another exemplary embodiment of the present invention, the metal layer 267E made of a conductive material having excellent flexibility may be separately formed, and the wire 220E formed of the same material as that of the metal layer 267E may be used to reduce a risk of breaking the wire 220E. As the wire 220E is formed of the same material as that of the additional metal layer 267E, the second passivation film 263E may be formed on the wire 220E at the non-display area "NA" of the flexible substrate 210E.

Since a case in which the thin film transistor 240E is an N-type thin film transistor is shown in FIG. 2E, it is noted that the metal layer 267E is formed between the source electrode 243E and the anode 251E. However, when the thin film transistor 240E is a P-type thin film transistor, the metal layer 267E may be formed between the drain electrode 244E and the anode 251E.

Figure 2F:
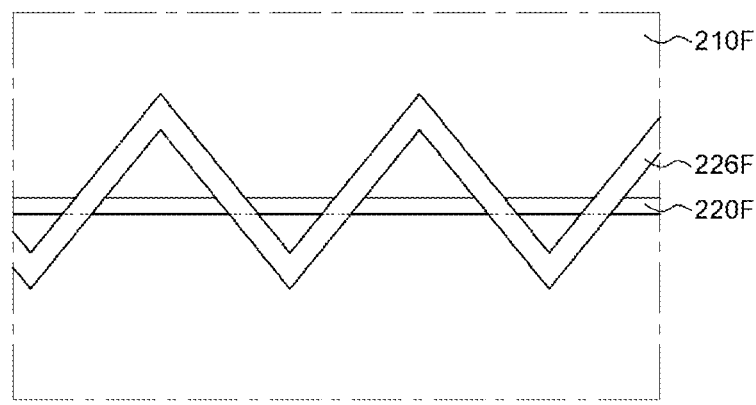
FIG. 2F is an exploded diagram of the flexible organic light emitting display device according to still another exemplary embodiment of the present invention.

FIG. 2F is an exploded diagram of a flexible organic light emitting display device according to still another exemplary embodiment of the present invention. FIG. 2F is a planar exploded diagram of a bending area of a flexible substrate 210F.

Referring to FIG. 2F, a conductive line 220F formed to contact with at least some portions of wires 226F positioned on a curved portion of the flexible substrate 210F. In a flexible organic light emitting display device 200F according to another exemplary embodiment of the present invention, the conductive line 220F coming in contact with the wires 226F may be used together with the wires 220F, some of which are formed transversal to the bending direction, to send the same signal through the wires 220F and the conductive line 226F. In this case, even when one of the wires 226F and the conductive line 220F is broken, a signal may be sent through the other.

The conductive line 220F may be formed to extend in various directions. The conductive line 220F may be formed to extend in a bending direction, as shown in FIG. 2F. However, the conductive line 220F may also be formed transversal to the bending direction, and formed in other various shapes. When the conductive line 220F is formed to extend in a direction different from the bending direction, the effect of the tensile force caused by the bending of the substrate and the strain of the conductive line 220F may be reduced so as to minimize the risk of breaking the conductive line 220F.

The conductive line 220F may be formed of the same material as the conductive material included in the display unit 230F formed on the flexible substrate 210F. For example, the conductive line 220F may be formed of the same material as that of one of the gate electrode 242F, the source electrode 243F, the drain electrode 244F, the reflective layer 252F, and the semi-transmissive layer.

For the sake of convenience of description, FIG. 2F shows that the wire 226F is directly formed on the conductive line 220F, but the present invention is not limited thereto. For example, the wire 226F may be formed after an insulation layer is formed on the conductive line 220F and a contact hole is formed in the insulation layer. In this case, the wire 226F may come in contact with the conductive line 220F through the contact hole formed in the insulation layer.

Figure 2G:
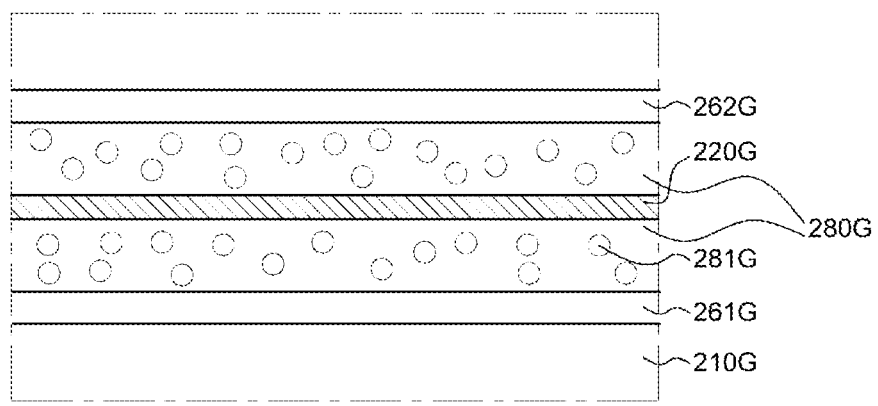
FIG. 2G is an exploded diagram of an area X of FIG. 2C according to still another exemplary embodiment of the present invention.

FIG. 2G is an exploded diagram of an area X of FIG. 2C according to yet another exemplary embodiment of the present invention.

Referring to FIG. 2G, crack prevention layers 280G may be disposed on the top and bottom surfaces of a wire 220G. More particularly, the crack prevention layers 280G may be disposed between the wire 220G and a substrate or an insulation layer formed under the wire 220G at a non-display area "NA" of a flexible substrate 210G, and between the wire 220G and the insulation layer formed on the wire 220G at the non-display area "NA" of the flexible substrate 210G. For the sake of convenience of description, FIG. 2G shows that a buffer layer 261G is formed as the insulation layer between the wire 220G and the flexible substrate 210G and a passivation film 262G is formed on a top surface of the wire 220G, but the present invention is not limited thereto. For example, various insulation layers may be formed. FIG. 2G shows that the crack prevention layers 280G are disposed on both the top and bottom surfaces of the wire 220G, but the present invention is not limited thereto. For example, the crack prevention layer 280G may be formed on one of the top and bottom surfaces of the wire 220G.

The crack prevention layer 280G may include a crack preventing material 281G such as a porous material or nanoparticles. The crack prevention layer 280G may have an interlayer structure in which the porous material or nanoparticles are dispersed in a packing layer made of an insulation material. Here, when the crack prevention layer 280G is formed with an interlayer structure including a porous material, the crack prevention layer 280G may be formed with an interlayer structure including a silica gel. On the other hand, when the crack prevention layer 280G is formed with an interlayer structure in which nanoparticles are dispersed, the crack prevention layer 280G may be formed with an interlayer structure including various nanoparticles such as silver (Ag). FIG. 2G shows that the crack prevention layer 280G is formed with an interlayer structure in which the porous material or nanoparticles are dispersed in the packing layer made of the insulation material. However, the crack prevention layer 280G may include only the nanoparticles, and may be formed with a structure in which the nanoparticles are dispersed between the wire 220G and the insulation layer.

When a non-display area of the flexible organic light emitting display device is bent, more cracks are caused at the other elements formed on upper and lower portion of the wire formed of the insulation material, compared with the wire formed of a metal. As a result, the wires may be cracked. Accordingly, in a flexible organic light emitting display device 200G according to still another exemplary embodiment of the present invention, the crack prevention layer 280G including the porous material or nanoparticles may be disposed on the top surface and/or the bottom surface of the wire 220G to allow the crack prevention layer 280G to absorb stress transferred from an upper or lower portion of the crack prevention layer 280G. Also, when the elements positioned on or under the crack prevention layer 280G are cracked, a crack direction is changed to other directions other than a direction perpendicular to the wire 220G to prevent the wire 220G from being cracked by cracks caused at the elements.

Figure 2H:
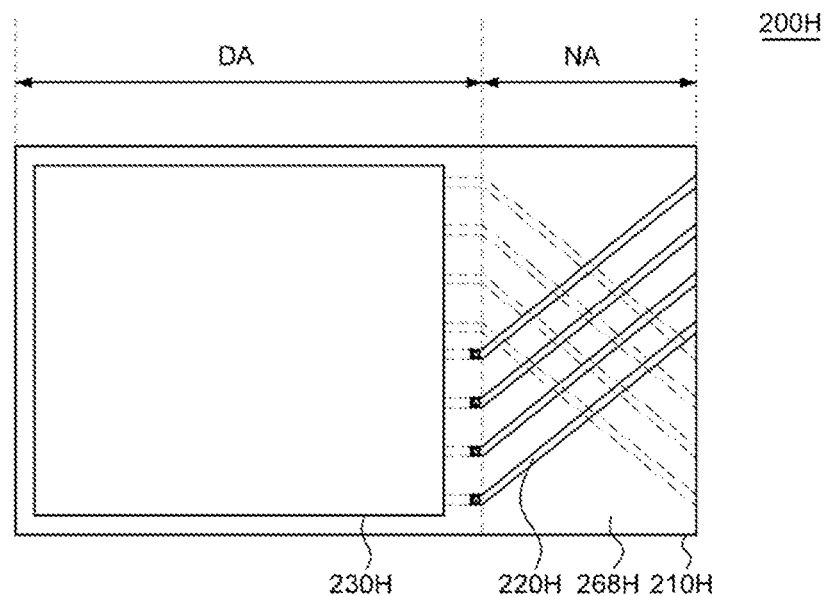
FIG. 2H is a top view showing an unbent state of the flexible organic light emitting display device according to still another exemplary embodiment of the present invention.

FIG. 2H is a top view showing an unbent state of the flexible organic light emitting display device according to still another exemplary embodiment of the present invention. Referring to FIG. 2H, a flexible organic light emitting display device 200H includes a flexible substrate 210H, a wire 220H, a separation layer 268H, and a display unit 230H. The flexible substrate 210H and the display unit 230H are substantially identical to the flexible substrate 210A and the display unit 230A shown in FIG. 2A, and thus repeated description of the flexible substrate 210H and the display unit 230H is omitted for brevity.

A plurality of wires 220H are formed on the flexible substrate 210H. When at least parts of the plurality of wires 220H are formed in an oblique direction and a bending area of the flexible substrate 210H corresponds to the entire non-display area "NA" of the flexible substrate 210H, the plurality of wires 220H formed on the non-display area "NA" of the flexible substrate 210H are formed in an oblique direction. Among the plurality of wires 220H positioned on the non-display area "NA" of the flexible substrate 210H, a first group of wires 220H may be formed in a first oblique direction, and a second group of wires 220H may be formed in a second oblique direction. Referring to FIG. 2H, the four wires 220H among the plurality of wires 220H positioned on the non-display area "NA" may be formed in a first oblique direction in which the four wires 220H are directed downward the flexible substrate 210H as shown in FIG. 2H, and the four wires 220H among the plurality of wires 220H positioned under the non-display area "NA" may be formed in a second slanted direction in which the four wires 220H are directed upward the flexible substrate 210H as shown in FIG. 2H.

In the flexible organic light emitting display device 200H according to still another exemplary embodiment of the present invention, the first group of wires 220H among the plurality of wires 220H is formed in a first oblique direction, and the second group of wires 220H among the plurality of wires 220H is formed in a second slanted direction, so that the wires 220H cannot extend toward a certain direction. Therefore, it is possible to facilitate connection between the wires 220H and the gate driver IC or the data driver IC and design the wires 220H more easily in the flexible organic light emitting display device 200H. For the sake of convenience of description, FIG. 2H shows that the first group of wires 220H are formed on the non-display area "NA" of the flexible substrate 210H, the second group of wires 220H are formed under the non-display area "NA" of the flexible substrate 210H, and the number of the wires 220H in each group is restricted to four (4), but the present invention is not limited thereto.

The same signal or different signals may be applied to a plurality of wires 220H. The same signal or different signals may be applied to first group wires 220H, and the same signal or different signals may be applied to second group wires 220H. That is, although the same numeral is assigned to the plurality of wires 220H, it is merely described that their own characteristics such as a configuration material or a formation location are the same, but it does not mean that the same signal is applied to all the plurality of wires 220H to transmit the same signal.

Referring to FIG. 2H, among the plurality of wires 220H, the first group of wire 220Hs may be crossed with the second group of wires 220H, as viewed from the top view. However, since the first group of wires 220H and the second group of wires 220H each independently transfer a signal, the first group of wires 220H should not be in contact with the second group of wires 220H. Therefore, in the flexible organic light emitting display device 200H according to yet another exemplary embodiment of the present invention, a separation layer 268H may be formed between the first group of wires 220H and the second group of wires 220H to insulate the first group of wires 220H from the second group of wires 220H. FIG. 2H shows that the wires 220H formed under the separation layer 268H among the wires 220H are indicated by dotted line, and the wires 220H formed on the separation layer 268H among the wires 220H are indicated by solid line.

Figure 2I:
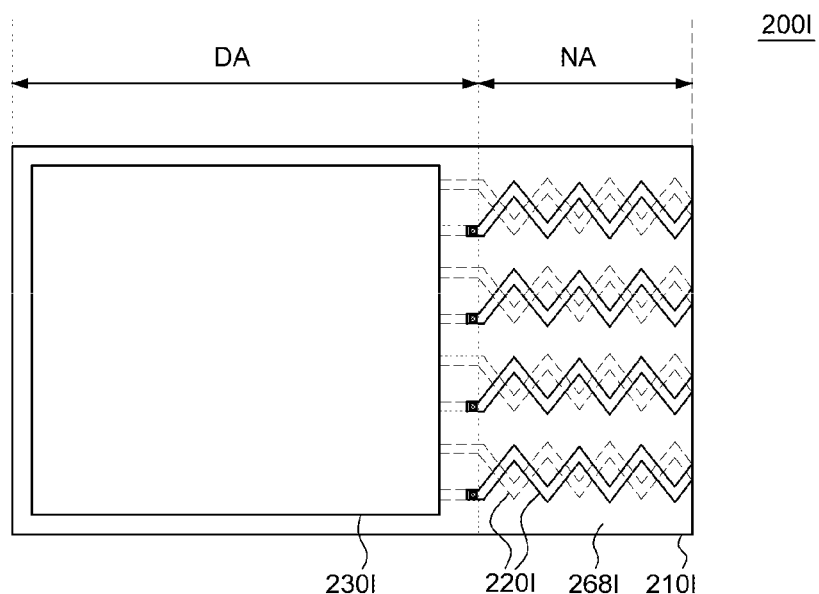
FIG. 2I is a top view showing an unbent state of the flexible organic light emitting display device according to yet another exemplary embodiment of the present invention.

FIG. 2I is a top view showing an unbent state of the flexible organic light emitting display device according to yet another exemplary embodiment of the present invention. Referring to FIG. 2I, a flexible organic light emitting device 200 includes a flexible substrate 210I, a wire 220I, a separation layer 268I, and a display 230I. The flexible substrate 210I, the separation layer 268I, and the display 230I are substantially the same as the flexible substrate 210H, the separate layer 268H, and the display 230H of FIG. 2H, and thus repeated description thereof will be omitted.

A plurality of wires 220I may be formed on the flexible substrate 210I. Referring to FIG. 2I, the plurality of wires 220I may be formed in various shapes including a triangular wave shape in a non-display area NA of the flexible substrate 210I. The plurality of wires 220I may be formed in a triangular wave shape including a portion extending to an oblique direction or in a repeated triangular wave shape as illustrated in FIG. 2I. For convenience of description, although FIG. 2I illustrates that the plurality of wires 220I are formed in a triangular wave shape, this is not limited thereto, and the plurality of pads 220I may be formed in various shapes such as a sawtooth wave shape, a square wave shape, a sinusoidal wave shape, an omega (Ω) shape, or a diamond shape.

The wires 220I includes first group wires 220I formed on the separation layer 268I, and second group wires 220I formed below the separation layer 268I. In FIG. 2I, the first group wires 220I are indicated as a solid line, and the second group wires 220I are indicated as a dotted line. The first group wires 220I and the second group wires 220I are alternately disposed in the non-display area NA of the flexible substrate 210I. The first group wires 220I and the second group wires 220I are electrically insulated by the separation layer 268I, and the first group wires 220I and formed so that triangular wave shapes of the first group wires 220I and triangular wave shapes of the second group wires 220I cross each other. Since the triangular wave shapes of the first group wires 220I and the triangular wave shapes of the second group wires 220I are formed to cross each other, a pitch between the wires 220I may be minimized, and high resolution of the flexible organic light emitting device 200I may be realized.

The same signal or different signals may be applied to the plurality of wires 220I. The same signal or different signals may be applied to the first group wires 220I, and the same signal or different signals may be applied to the second group wires 220I. That is, although the same numeral is assigned to the plurality of wires 220I, it is merely described that their own characteristics such as a configuration material or a formation location are the same, but it does not mean that the same signal is applied to all the plurality of wires 220I to transmit the same signal.

Figure 2J:
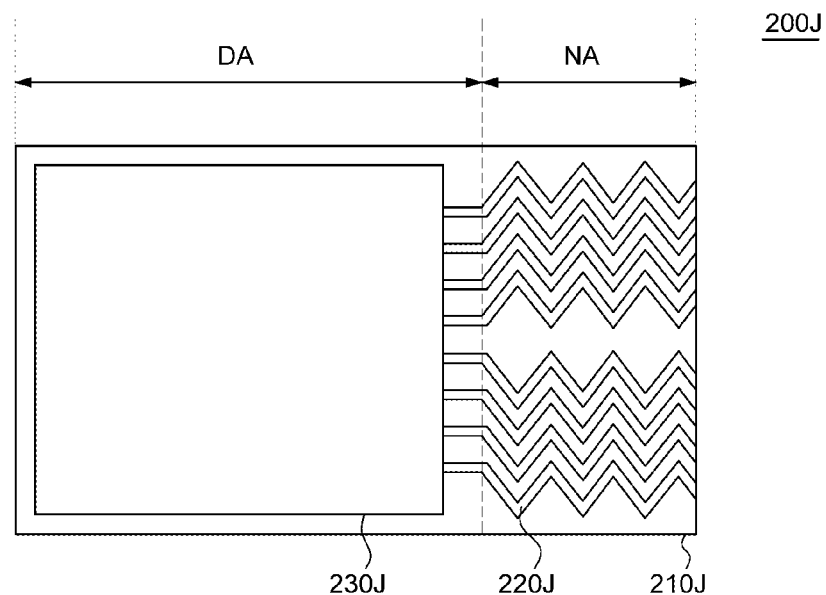
FIG. 2J is a top view showing an unbent state of the flexible organic light emitting display device according to yet another exemplary embodiment of the present invention.

FIG. 2J is a top view showing an unbent state of the flexible organic light emitting display device according to yet another exemplary embodiment of the present invention. Referring to FIG. 2J, a flexible organic light emitting display device 200I includes a flexible substrate 210J, a wire 220J, and a display unit 230J. The flexible substrate 210J and the display unit 230J are substantially identical to the flexible substrate 210A and the display unit 230A shown in FIG. 2A, and thus repeated description of the flexible substrate 210J and the display unit 230J is omitted for brevity.

A plurality of wires 220J are formed on the flexible substrate 210J. When at least parts of the plurality of wires 220J are formed in a slanted direction and a bending area of the flexible substrate 210J corresponds to the entire non-display area "NA" of the flexible substrate 210J, the plurality of wires 220J positioned on the non-display area "NA" of the flexible substrate 210J are formed in an slanted direction.

Referring to FIG. 2J, the plurality of wires 220J may be formed in various shapes such as a chopping wave shape at the non-display area "NA" of the flexible substrate 210J. The plurality of wires 220J may be formed in a chopping wave shape, which has a portion extending in a slanted direction. As shown in FIG. 2J, the plurality of wires 220J may be formed in a series of chopping wave shapes. For the sake of convenience of description, FIG. 2J shows that the plurality of wires 220J are formed in a chopping wave shape, but the present invention is not limited thereto. For example, the plurality of wires 220J may be formed in various shapes such as a sawtooth wave shape, a square wave shape, a sine wave shape, an omega (Ω) shape, and a lozenge shape.

Among the plurality of wires 220J formed on the non-display area "NA" of the flexible substrate 210J, the first group of wires 220J and the second group of wires 220J may be formed so that the first group of wires 220J can be symmetrical to the second group of wires 220J. Referring to FIG. 2J, the four wires 220J among the plurality of wires 220J positioned on the non-display area "NA" may be formed in a first slanted direction in which the four wires 220J are directed upward the flexible substrate 210J from the boundary between the display area "DA" and the non-display area "NA" of the flexible substrate 210J as shown in FIG. 2J, and the four wires 220J among the plurality of wires 220J positioned under the non-display area "NA" may be formed in a second oblique direction in which the four wires 220J are directed downward the flexible substrate 210J from the boundary between the display area "DA" and non-display area "NA" of the flexible substrate 210J as shown in FIG. 2J. Therefore, the chopping wave shape in which the four wires 220J among the plurality of wires 220J positioned under the non-display area "NA" are formed may be inverted, or symmetrical to the chopping wave shape in which the four wires 220J among the plurality of wires 220J positioned on the non-display area "NA" are formed. For the sake of convenience of description, FIG. 2J shows that the first group of wires 220J are formed on the non-display area "NA" of the flexible substrate 210J, the second group of wires 220J are formed under the non-display area "NA" of the flexible substrate 210J, and the number of the wires 220J in each group is restricted to four (4), but the present invention is not limited thereto.

Figure 3A:
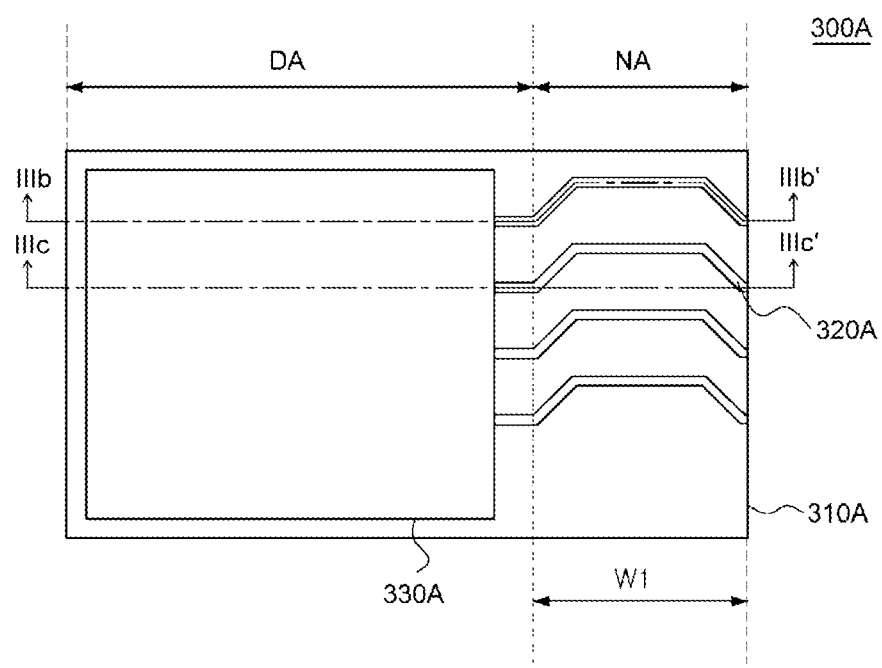
FIG. 3A is a top view showing an unbent state of the flexible organic light emitting display device according to still another exemplary embodiment of the present invention.
Figure 3B:
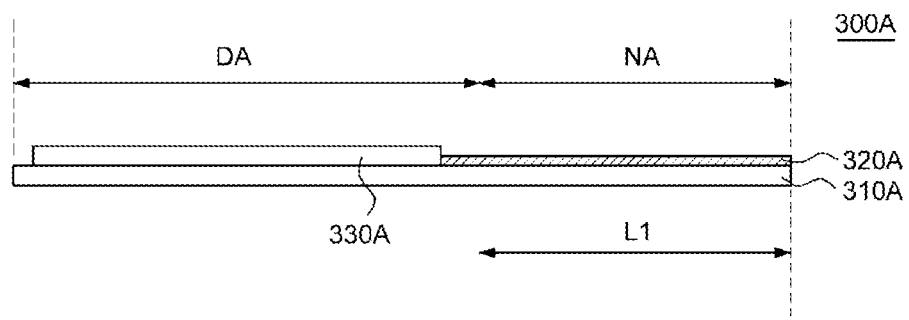
FIG. 3B is a cross-sectional view of the flexible organic light emitting display device, taken along line IIIb-IIIb' shown in FIG. 3A.
Figure 3C:
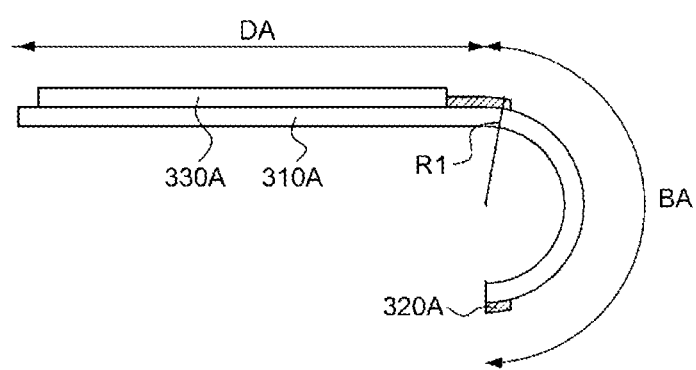
FIG. 3C is a cross-sectional view showing a bent state of the flexible organic light emitting display device according to still another exemplary embodiment of the present invention, taken along line IIIc-IIIc' shown in FIG. 3A.

FIG. 3A is a top view showing an unbent state of the flexible organic light emitting display device according to another exemplary embodiment of the present invention. FIG. 3B is a cross-sectional view of the flexible organic light emitting display device, taken along line IIIb-IIIb' shown in FIG. 3A. FIG. 3C is a cross-sectional view showing a bent state of the flexible organic light emitting display device according to still another exemplary embodiment of the present invention, taken along line IIIc-IIIc' shown in FIG. 3A. Referring to FIGS. 3A to 3C, a flexible organic light emitting display device 300A includes a flexible substrate 310A, a wire 320A, and a display unit 330A. The display unit 330A is substantially identical to the display units 230A, 230D, 230E, and 230H shown in FIGS. 2A to 2H, and thus repeated description of the display unit 330A is omitted for brevity.

The flexible substrate 310A is a substrate configured to support various elements of the flexible organic light emitting display device 300A. Here, the flexible substrate 310A is endowed with flexibility. The flexible substrate 310A includes a display area "DA" and a bending area "BA" that is a non-display area. The display area "DA" of the flexible substrate 310A refers to an area on which an image is actually displayed, and the bending area "BA" of the flexible substrate 310A refers to an area on which no image is displayed and is actually bent.

The bending area "BA" of the flexible substrate 310A is an area extending from the display area "DA" of the flexible substrate 310A. The bending area "BA" of the flexible substrate 310A extends from one side of the display area "DA" of the flexible substrate 310A. For example, the display area "DA" of the flexible substrate 310A may be formed in a polygonal shape, and the bending area "BA" of the flexible substrate 310A may extend from one side of the display area "DA" of the flexible substrate 310A. For the sake of convenience of description, FIG. 3A shows that the bending area "BA" of the flexible substrate 310A extends from one side of the display area "DA" of the flexible substrate 310A, but the present invention is not limited thereto. For example, the bending area "BA" of the flexible substrate 310A may extend from a plurality of sides of the display area "DA" of the flexible substrate 310A.

Since the bending area "BA" of the flexible substrate 310A is positioned on a peripheral or edge portion of the display area "DA" of the flexible substrate 310A and various circuits for displaying an image are disposed on the bending area "BA" of the flexible substrate 310A, the bending area "BA" of the flexible substrate 310A may also be referred to as a peripheral area, a peripheral circuit area, an edge area, or a bezel area.

The wire 320A is formed on the flexible substrate 310A. The wire 320A may electrically connect the display unit 330A formed on the display area "DA" of the flexible substrate 310A with a drive circuit unit, a gate driver IC, or a data driver IC, which may be formed on the bending area "BA" of the flexible substrate 310A, to send a signal. The wire 320A may be formed of the same material as one of the conductive materials constituting the display unit 330A. Since the wire 320A includes a portion extending from the bending area "BA" in a direction different from a bending direction, the wire 320A may be formed in various shapes as described above. For the sake of convenience of description, FIG. 3A shows that the wire 320A is formed in a trapezoidal wave shape. However, the wire 320A may be formed in various shapes such as a chopping wave shape, a sawtooth wave shape, a square wave shape, a sine wave shape, an omega ($\Omega$) shape, and a lozenge shape, and may also be formed in an oblique shape.

A length L1 of the wire 320A formed on the bending area "BA" is greater than a width W1 of the bending area "BA". The length L1 of the wire 320A formed on the bending area "BA" refers to a length of the wire 320A as measured in an extension direction of the wire 320A, and the width W1 of the bending area "BA" refers to a width of the bending area "BA" in a bending direction. Therefore, referring to FIGS. 3A to 3C, since the bending area "BA" of the flexible substrate 310A is bent in a horizontal direction of the flexible substrate 310A, the width W1 of the bending area "BA" refers to a width of the bending area "BA" in a horizontal direction, and the length L1 of the wire 320A formed on the bending area "BA" refers to a length of the wire 320A as measured in an extension direction of the wire 320A, that is, a length of the wire 320A formed on the bending area "BA" in the cross-sectional view of the flexible organic light emitting display device 300A shown in FIG. 3B. In the flexible organic light emitting display device 300A according to another exemplary embodiment of the present invention, a length L1 of the wire 320A formed on the bending area "BA" is greater than a width W1 of the bending area "BA". That is, since the wire 320A formed on the bending area "BA" includes a portion extending in a direction different from a bending direction, the length L1 of the wire 320A formed on the bending area "BA" is greater than the width W1 of the bending area "BA". As a result, a tensile force applied to the wire 320A formed on the bending area "BA" may be lowered to reduce a risk of breaking the wire 320A.

A width of the bending area "BA" of the flexible substrate 310A is proportional to a bending radius of curvature. The relationship between the width of the bending area "BA" and the bending radius of curvature will be described in further detail with reference to FIGS. 3D and 3E.

Figure 3D:
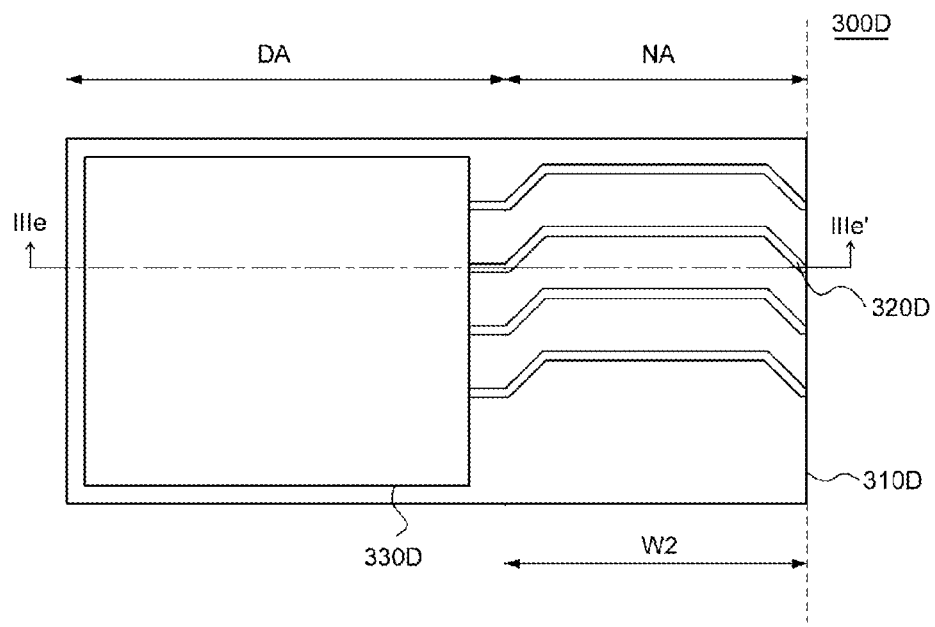
FIG. 3D is a top view showing an unbent state of the flexible organic light emitting display device according to still another exemplary embodiment of the present invention.
Figure 3E:
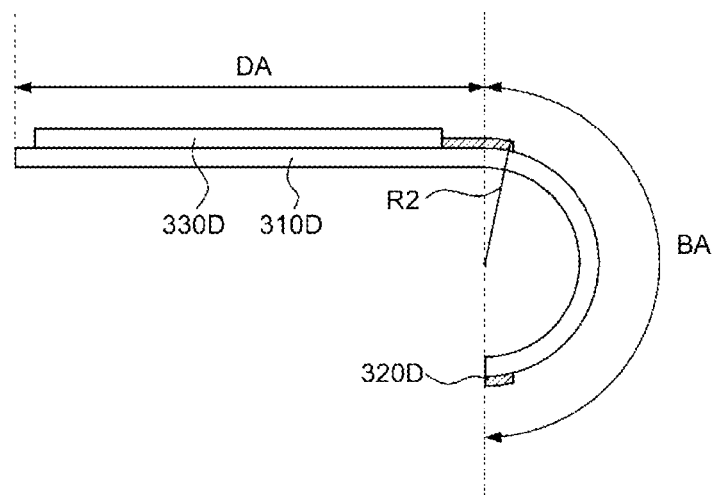
FIG. 3E is a cross-sectional view showing a bent state of the flexible organic light emitting display device according to still another exemplary embodiment of the present invention.

FIG. 3D is a top view showing an unbent state of the flexible organic light emitting display device according to still another exemplary embodiment of the present invention. FIG. 3E is a cross-sectional view showing a bent state of the flexible organic light emitting display device according to still another exemplary embodiment of the present invention.

Referring to FIGS. 3D and 3E, a width W2 of a bending area "BA" of a flexible substrate 310D is greater than the width W1 of the bending area "BA" of the flexible substrate 310D shown in FIGS. 3A to 3C. As a result, the flexible substrate 310D, a wire 320D, and a display unit 330D are substantially identical to the flexible substrate 310A, the wire 320A, and the display unit 330A shown in FIGS. 3A to 3C, except that the wire 320D has a greater length, and thus repeated description of the flexible substrate 310D, the wire 320D, and the display unit 330D is omitted for brevity.

The widths of the bending areas "BA" of the flexible substrates 310A and 310D are proportional to the bending radius of curvature. In this specification, the term "bending radius of curvature" refers to an outer radius spanning from the center of a circle to each of the outermost elements of the flexible organic light emitting display devices 300A and 300D when the flexible organic light emitting display devices 300A and 300D are bent along a circular shape. Referring to FIG. 3C, for example, a bending radius of curvature R1 of the flexible organic light emitting display device 300A shown in FIG. 3C refers to a distance between the center of a circle and the outermost portion of the wire 320A at the bending area "BA". Referring to FIG. 3E, a bending radius of curvature R2 of the flexible organic light emitting display device 300D shown in FIG. 3E refers to a distance between the center of a circle and the outermost portion of the wire 320D at the bending area "BA".

Since the bending radius of curvature refers to the distances between the center of the circle and the outermost portions of the wires 320A and 320D at the bending area "BA", an arc portion of the bending area "BA" increases in arc length with an increase in bending radius of curvature. As a result, the bending area "BA" corresponding to the arc portion of the bending area "BA" also increases in width. Also, since the arc portion of the bending area "BA" decreases in arc length with a decrease in bending radius of curvature, the bending area "BA" corresponding to the arc portion of the bending area "BA" also decreases in width. Therefore, since the bending radius of curvature R1 of the flexible organic light emitting display device 300A shown in FIGS. 3A to 3C is smaller than the bending radius of curvature R2 of the flexible organic light emitting display device 300D shown in FIGS. 3D and 3E, the width W1 of the bending area "BA" of the flexible substrate 310A in the flexible organic light emitting display device 300A shown in FIGS. 3A to 3C is also smaller than the width W2 of the bending area "BA" of the flexible substrate 310D in the flexible organic light emitting display device 300D shown in FIGS. 3D and 3E.

Figure 3F:
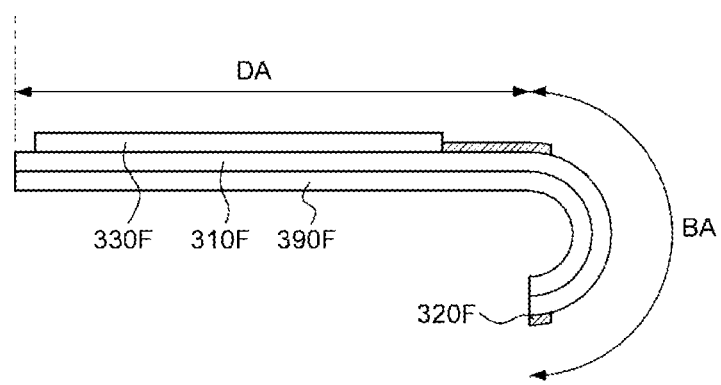
FIG. 3F is a cross-sectional view showing a bent state of the flexible organic light emitting display device according to yet another exemplary embodiment of the present invention.

FIG. 3F is a cross-sectional view showing a bent state of the flexible organic light emitting display device according to yet another exemplary embodiment of the present invention. Referring to FIG. 3F, a flexible organic light emitting display device 300F include a support film 390F, a flexible substrate 310F, a wire 320F, and a display unit 330F. The flexible substrate 310F, the wire 320F, and the display unit 330F are substantially identical to the flexible substrate 310A, the wire 320A, and the display unit 330A shown in FIGS. 3A to 3C, and thus repeated description of the flexible substrate 310F, the wire 320F, and the display unit 330F is omitted for brevity.

The support film 390F is disposed to come in contact with the flexible substrate 310F. When it is assumed that one surface of the flexible substrate 310F on which the display unit 330F is disposed is a top or front surface of the flexible substrate 310F, one surface of the flexible substrate 310F with which the support film 390F comes in contact may be referred to as a bottom or rear surface of the flexible substrate 310F. Accordingly, the support film 390F may be referred to as a support substrate, a back film, a rear film, a second flexible substrate, or a protective film.

The support film 390F serves to support the flexible substrate 310F. As described above, the flexible substrate 310F is in the form of a flexible plastic thin film. However, when the flexible substrate 310F is formed of a plastic film, the flexible substrate 310F is vulnerable to penetration of moisture and air from the outside. As a result, there is a possibility of the elements including the display unit 330F formed on the flexible substrate 310F becoming damaged. Therefore, in the flexible organic light emitting display device 300F according to still another exemplary embodiment of the present invention, the support film 390F may be disposed on a rear surface of the flexible substrate 310F to minimize damage of the elements including the display unit 330F caused by penetration of moisture and air from the outside. The support film 390F may be formed of substantially the same material as that of the flexible substrate 310F, but may have a relatively greater thickness than the flexible substrate 310F. The support film 390F may be formed in a shape and size corresponding to those of the flexible substrate 310F.

Figure 4:
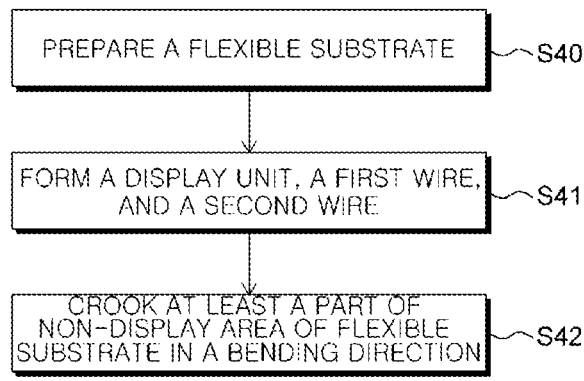
FIG. 4 is a flowchart illustrating a method of manufacturing a flexible organic light emitting display device according to one exemplary embodiment of the present invention.

FIG. 4 is a flowchart illustrating a method of manufacturing a flexible organic light emitting display device according to one exemplary embodiment of the present invention. First, a flexible substrate including a display area and a non-display area extending from the display area is prepared (S40). Preparation of the flexible substrate is substantially identical to preparation of the flexible substrate shown in FIGS. 1A to 3F, and thus repeated description of the preparation of the flexible substrate is omitted for brevity.

Next, a display unit including an organic light emitting diode and a thin film transistor is formed on the display area of the flexible substrate (S41). Formation of the display unit is substantially identical to formation of the display unit shown in FIGS. 1A to 3H, and thus repeated description of the formation of the display unit is omitted for brevity.

In some exemplary embodiments, the forming of the display unit may include forming a first wire on the display area of the flexible substrate, and forming a second wire, which is electrically connected to the first wire, on the non-display area of the flexible substrate. Since the first and second wires are formed of the same material as one of the conductive materials used to form the display unit, the first and second wires may be formed together with a process of forming a display unit. In some exemplary embodiments, the forming of the second wire may include forming a second wire, which includes a first portion extending in a first direction and a second portion extending in a second direction, on at least a part of the non-display area of the flexible substrate. Here, the second wire formed on at least a part of the non-display area of the flexible substrate may include a wire portion formed in at least one shape selected from the group consisting of a chopping wave shape, a sawtooth wave shape, a square wave shape, a sine wave shape, an omega (Ω) shape, a trapezoidal wave shape, and a lozenge shape, and also include a wire portion formed in an oblique direction. Subsequently, at least a part of the non-display area of the flexible substrate is curved in a bending direction (S42).

According to the present invention, a flexible display substrate and a flexible organic light emitting display device capable of minimizing breaking of wires caused by stress concentrating on a bending portion, and a method of manufacturing the same can be provided.

According to the present invention, a flexible display substrate and a flexible organic light emitting display device capable of ensuring high flexibility and simplifying a process as the same metal as a metal included in a display unit is used for wires, and a method of manufacturing the same can be provided.

According to the present invention, a flexible display substrate and a flexible organic light emitting display device capable of minimizing transfer of breaking of wires caused at a portion having low flexibility to other portions, and a method of manufacturing the same can also be provided.

The above-described effects according to the present invention are not intended to limit the contents used herein, and further effects may be encompassed in this specification.

It will be apparent to those skilled in the art that various modifications can be made to the above-described exemplary embodiments of the present invention without departing from the scope of the invention. Thus, it is intended that the present invention covers all such modifications provided they come within the scope of the appended claims and their equivalents.

What is claimed is:

1. A flexible display device comprising:
   a flexible substrate including:
      a substantially flat area extending along a plane, and
      a curved bending area adjacent to the substantially flat area and bending away from the plane;
   a plurality of thin film transistors on the flexible substrate to operate pixels on the flexible substrate;
   a wire on the bending area, the wire including a plurality of first portions extending in a first direction forming a first angle relative to a boundary line between the substantially flat area and the curved bending area, and a plurality of second portions extending in a second direction forming a second angle relative to the boundary line, the second angle different from the first angle, the first portions and the second portions providing multiple routes for an electrical signal via the wire; and
   another wire electrically insulated from the wire on the bending area and carrying the same signal as the wire carries, and
   wherein the wire is multi-layered, and wherein at least two layers of the wire are of different materials selected from the group consisting of molybdenum (Mo), aluminum (Al), chromium (Cr), gold (Au), silver (Ag), titanium (Ti), nickel (Ni), neodymium (Nd), and copper (Cu).

2. The flexible display device of claim 1, wherein each of the pixels comprises an organic light emitting diode (OLED).

3. The flexible display device of claim 1, wherein the first angle is an acute angle.

4. The flexible display device of claim 3, wherein the first portions and the second portions have a same length.

5. The flexible display device of claim 1, further comprising:
   a crack prevention layer between the wire and the flexible substrate; and
   a planarization member to smoothen a surface of at least one layer formed on the wire.

6. The flexible display device of claim 1, wherein the first and second portions form a series of connected diamond shapes.

7. The flexible display device of claim 1, further comprising a conductive line extending across the bending area to carry the same signal as the wire, the wire is placed in a first layer of the bending area and the conductive line is placed in a second layer in the bending area different from the first layer.

8. The flexible display device of claim 1, further comprising:
   a separation layer formed on the wire, and
   wherein the other wire is formed on the separation layer and intersects with the wire over the separation layer.

9. The flexible display device of claim 1, wherein each of the thin film transistors comprises a gate, a drain and a source, wherein the wire is made of a same material as at least one of the gate, the drain and the source.

10. A flexible organic light emitting diode (OLED) display device comprising:
    a flexible substrate having a curved portion bent in a bending direction;
    a wire electrically coupled between a display unit on the flexible substrate and a drive circuit unit, the wire includes a plurality of first portions and second portions forming a series of diamond shapes connected to each other and disposed on the curved portion of the flexible substrate, wherein the portion of the wire disposed on the curved portion has a greater length than a length of the curved portion of the flexible substrate; and
    another wire electrically insulated from the wire on the bending area and carrying the same signal as the wire carries; and
    wherein the wire is multi-layered wherein at least two layers of the wire are of different materials selected from the group consisting of molybdenum (Mo), aluminum (Al), chromium (Cr), gold (Au), silver (Ag), titanium (Ti), nickel (Ni), neodymium (Nd) and copper (Cu).

11. The flexible OLED display device of claim 10, wherein the first angle is an acute angle.

12. The flexible OLED display device of claim 10, wherein the first portions and the second portions have a same length.

13. The flexible OLED display device of claim 10, further comprising:
    a crack prevention layer between the wire and the flexible substrate; and
    a planarization member to smoothen a surface of at least one layer formed on the wire.

14. A flexible organic light emitting diode (OLED) display device comprising:
    a flexible substrate having a flat portion and a curved portion, the flat portion including a display area and a portion of a non-display area, the curved portion including another portion of the non-display area;
    a plurality of thin film transistors in the display area of the flexible substrate to operate pixels in the display are of the flexible substrate;
    a wire between the display area of the flexible substrate and a circuit in the non-display area of the flexible substrate, the wire having portions disposed on the curved portion of the flexible substrate, wherein the portions of the wire disposed on the curved portion has a length longer than an arc length of the curved portion taken along a section of the curved portion perpendicular to a boundary line between the flat portion and the curved portion; and
    another wire electrically insulated from the wire on the bending area and carrying the same signal the wire carries.

15. The flexible OLED display device of claim 14, wherein the wire is made of a same material as electrodes of the plurality of thin film transistors.

16. The flexible OLED display device of claim 14, wherein the portions form a series of diamond shapes connected to each other.

17. The flexible OLED display device of claim 14, wherein the wire is multi-layered, and at least two layers of the wire are of different materials selected from the group consisting of molybdenum (Mo), aluminum (Al), chromium (Cr), gold (Au) silver (Ag), titanium (Ti), nickel (Ni), neodymium (Nd) and copper (Cu).

18. The flexible OLED display device of claim 14, wherein a plurality of pixels are provided on the flexible substrate and the wire extends across a portion of the flexible substrate in which the plurality of pixels are not provided.

* * * * *